(12) United States Patent
Kim et al.

(10) Patent No.: US 11,107,830 B2
(45) Date of Patent: Aug. 31, 2021

(54) INTEGRATED ASSEMBLIES HAVING VERTICALLY-SPACED CHANNEL MATERIAL SEGMENTS, AND METHODS OF FORMING INTEGRATED ASSEMBLIES

(71) Applicant: Micron Technology, Inc., Boise, ID (US)

(72) Inventors: Byeung Chul Kim, Boise, ID (US); Francois H Fabreguette, Boise, ID (US); Richard J. Hill, Boise, ID (US); Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/548,267

(22) Filed: Aug. 22, 2019

(65) Prior Publication Data

US 2021/0057436 A1 Feb. 25, 2021

(51) Int. Cl.
| | |
|---|---|
| *H01L 27/11582* | (2017.01) |
| *H01L 27/11556* | (2017.01) |
| *H01L 29/51* | (2006.01) |
| *H01L 29/49* | (2006.01) |
| *H01L 21/28* | (2006.01) |
| *H01L 29/788* | (2006.01) |

(Continued)

(52) U.S. Cl.
CPC .... *H01L 27/11582* (2013.01); *H01L 21/0214* (2013.01); *H01L 21/0217* (2013.01); *H01L 21/02164* (2013.01); *H01L 21/02236* (2013.01); *H01L 27/11556* (2013.01); *H01L 29/40114* (2019.08); *H01L 29/40117* (2019.08); *H01L 29/4991* (2013.01); *H01L 29/513* (2013.01); *H01L 29/517* (2013.01); *H01L 29/7883* (2013.01); *H01L 29/792* (2013.01)

(58) Field of Classification Search
CPC ......... H01L 27/11582; H01L 27/11556; H01L 29/40114; H01L 29/40117; H01L 29/4991; H01L 29/513; H01L 29/517; H01L 29/7883; H01L 29/792
See application file for complete search history.

(56) References Cited

U.S. PATENT DOCUMENTS

| | | | |
|---|---|---|---|
| 10,164,009 B1 * | 12/2018 | Carlson | H01L 27/11568 |
| 2006/0118890 A1 * | 6/2006 | Li | H01L 29/4975 |
| | | | 257/410 |

(Continued)

*Primary Examiner* — Peniel M Gumedzoe
(74) *Attorney, Agent, or Firm* — Wells St. John P.S.

(57) ABSTRACT

Some embodiments include a NAND memory array having a vertical stack of alternating insulative levels and conductive levels. The conductive levels include control gate regions and include second regions proximate to the control gate regions. High-k dielectric structures are directly against the control gate regions and extend entirely across the insulative levels. Charge-blocking material is adjacent to the high-k dielectric structures. Charge-storage material is adjacent to the charge-blocking material. The charge-storage material is configured as segments which are vertically stacked one atop another, and which are vertically spaced from one another. Gate-dielectric material is adjacent to the charge-storage material. Channel material extends vertically along the stack and is adjacent to the gate-dielectric material. Some embodiments include integrated assemblies, and methods of forming integrated assemblies.

30 Claims, 22 Drawing Sheets

(51) Int. Cl.
    *H01L 21/02*     (2006.01)
    *H01L 29/792*     (2006.01)

(56) References Cited

U.S. PATENT DOCUMENTS

2016/0284719 A1*  9/2016  Zhu .................... H01L 27/1157
2017/0271527 A1*  9/2017  Higuchi ............... H01L 23/528
2017/0278859 A1*  9/2017  Sharangpani ..... H01L 27/11582
2019/0103411 A1*  4/2019  Liu ................... H01L 27/11568

* cited by examiner

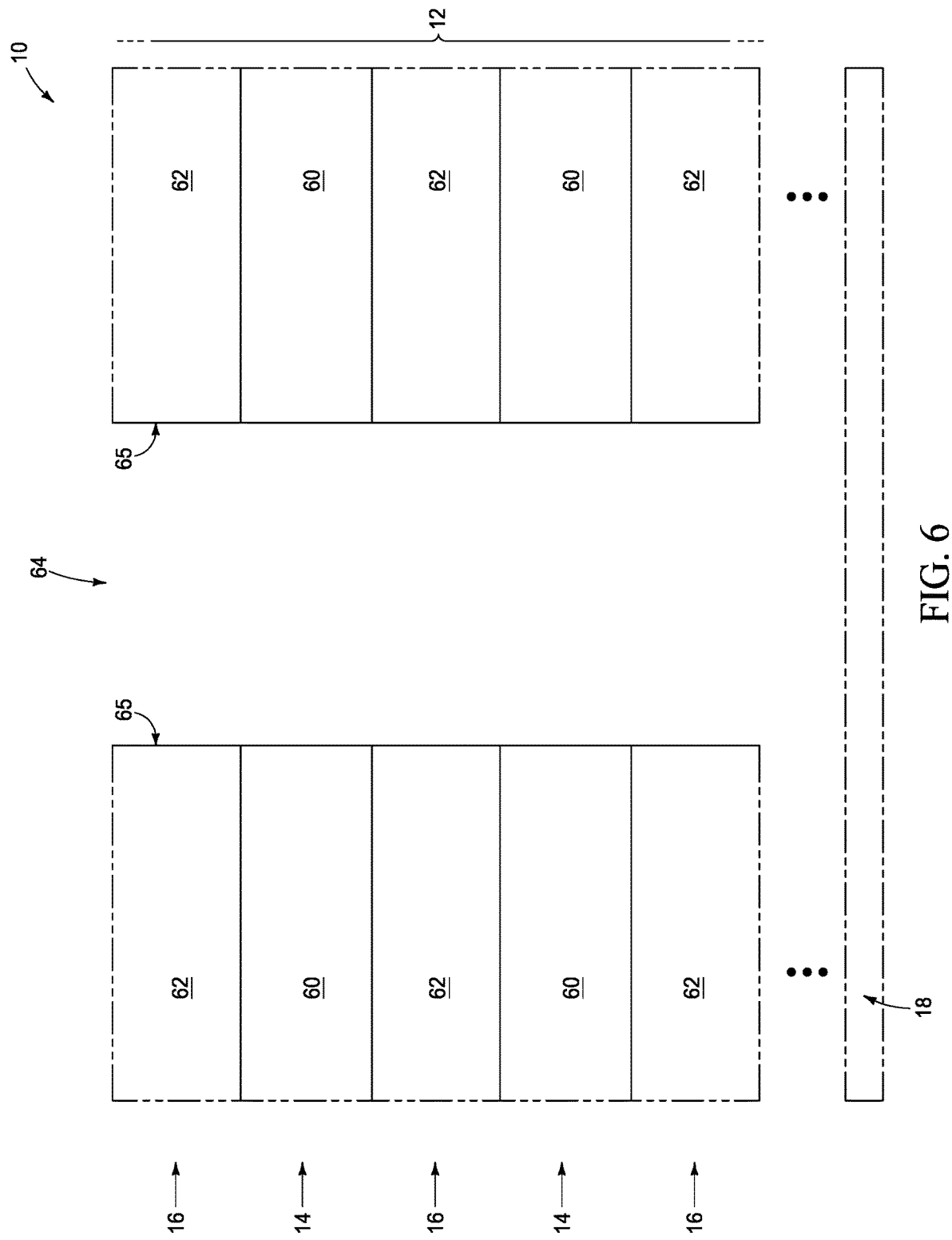

US 11,107,830 B2

INTEGRATED ASSEMBLIES HAVING VERTICALLY-SPACED CHANNEL MATERIAL SEGMENTS, AND METHODS OF FORMING INTEGRATED ASSEMBLIES

TECHNICAL FIELD

Integrated assemblies (e.g., integrated NAND memory) having vertically-spaced channel material segments, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device 2101 is connected to the source of charge-storage transistor $208_1$ of the corresponding NAND string 2061. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIGS. 5 and 6 are diagrammatic cross-sectional side views of a region of an integrated assembly shown at example sequential process stages of an example method for forming an example NAND memory array.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and such can lead to charge migration from one memory cell to another. The charge migration may lead to data retention problems. Some embodiments include NAND architectures having breaks in the charge-trapping material in regions between memory cells; and such breaks may advantageously impede migration of charge between memory cells. Example embodiments are described with reference to FIGS. 5-21.

Figure 1:
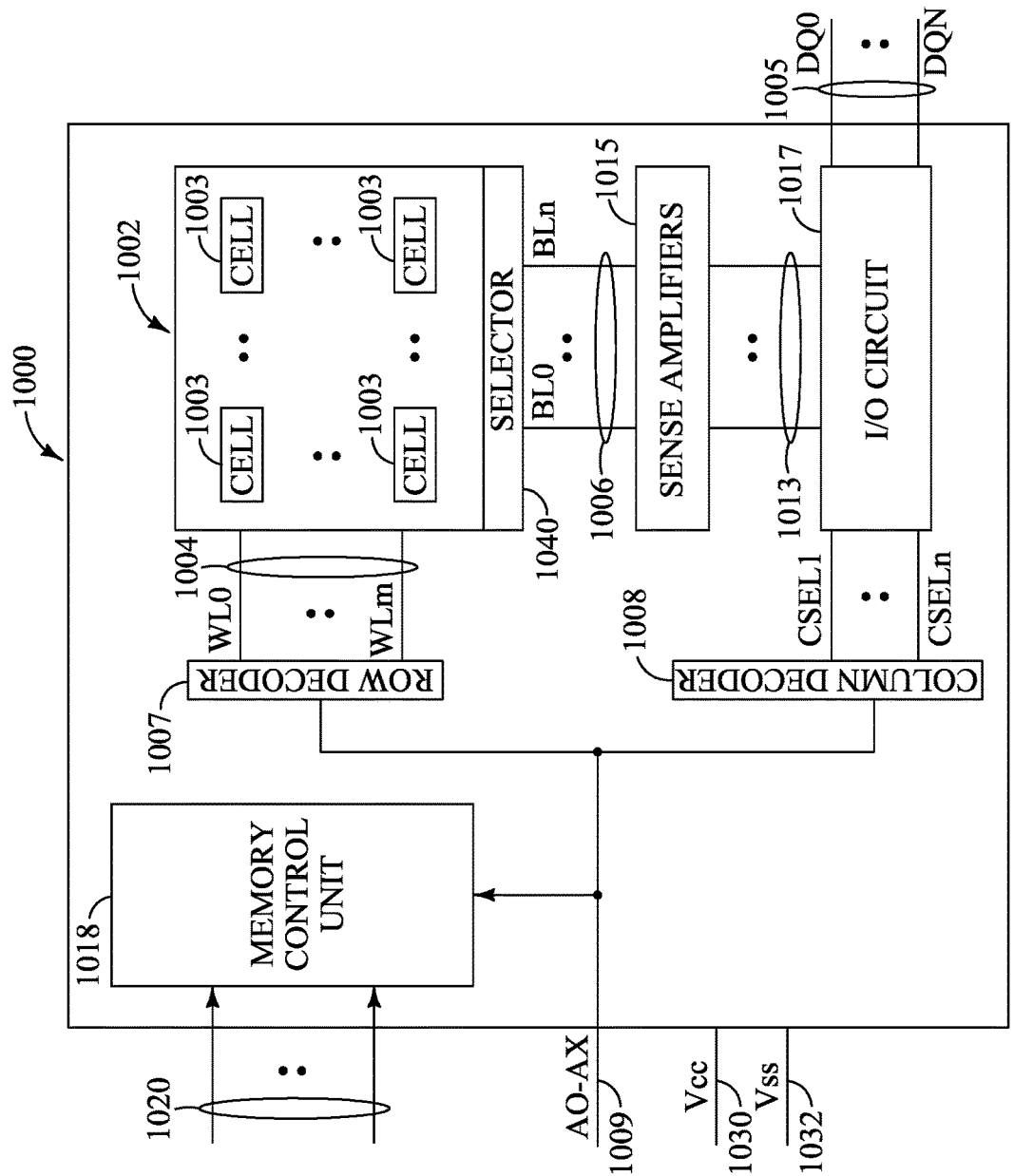
FIG. 1 shows a block diagram of a prior art memory device having a memory array with memory cells.
Figure 2:
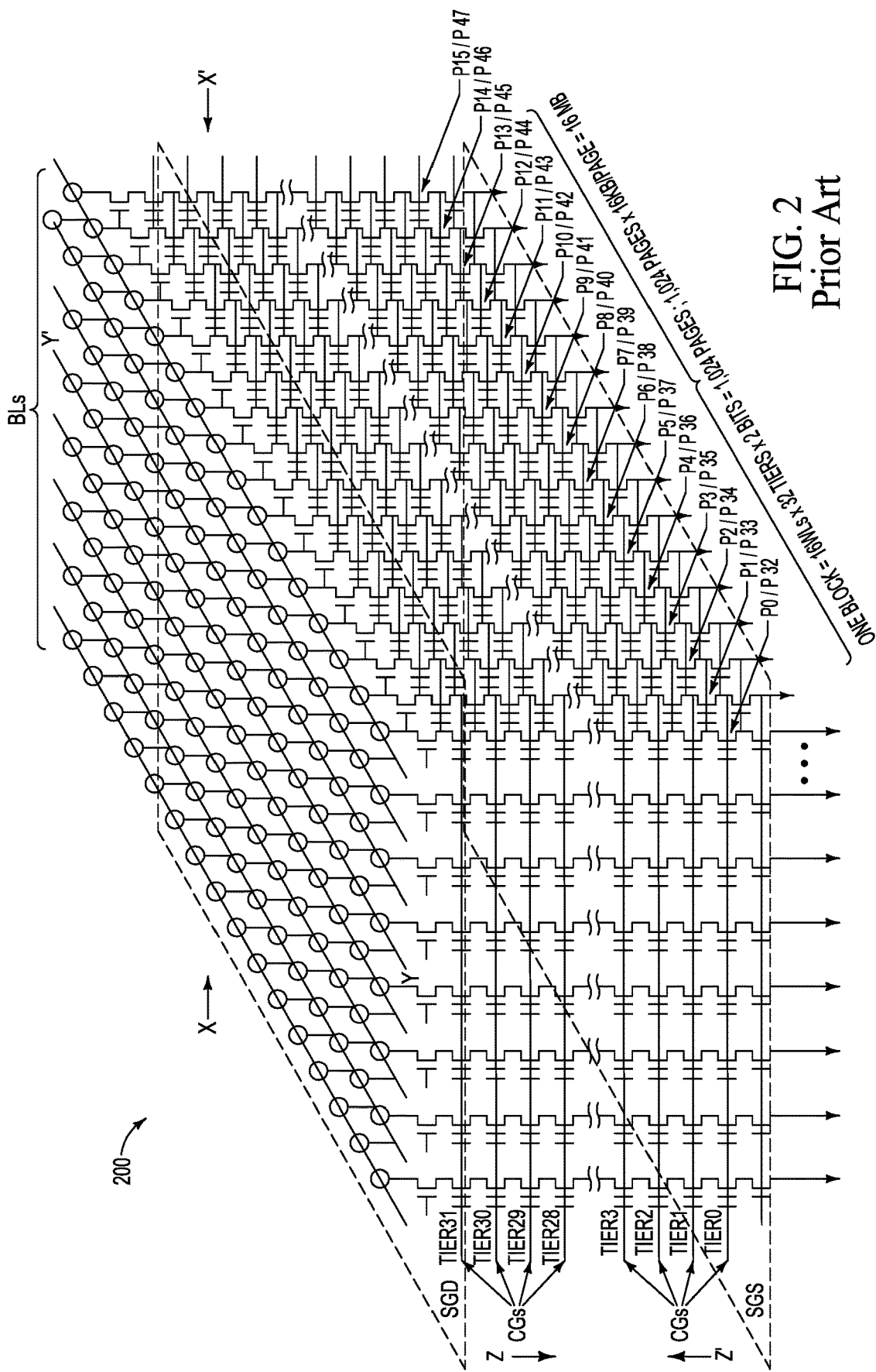
FIG. 2 shows a schematic diagram of the prior art memory array of FIG. 1 in the form of a 3D NAND memory device.
Figure 3:
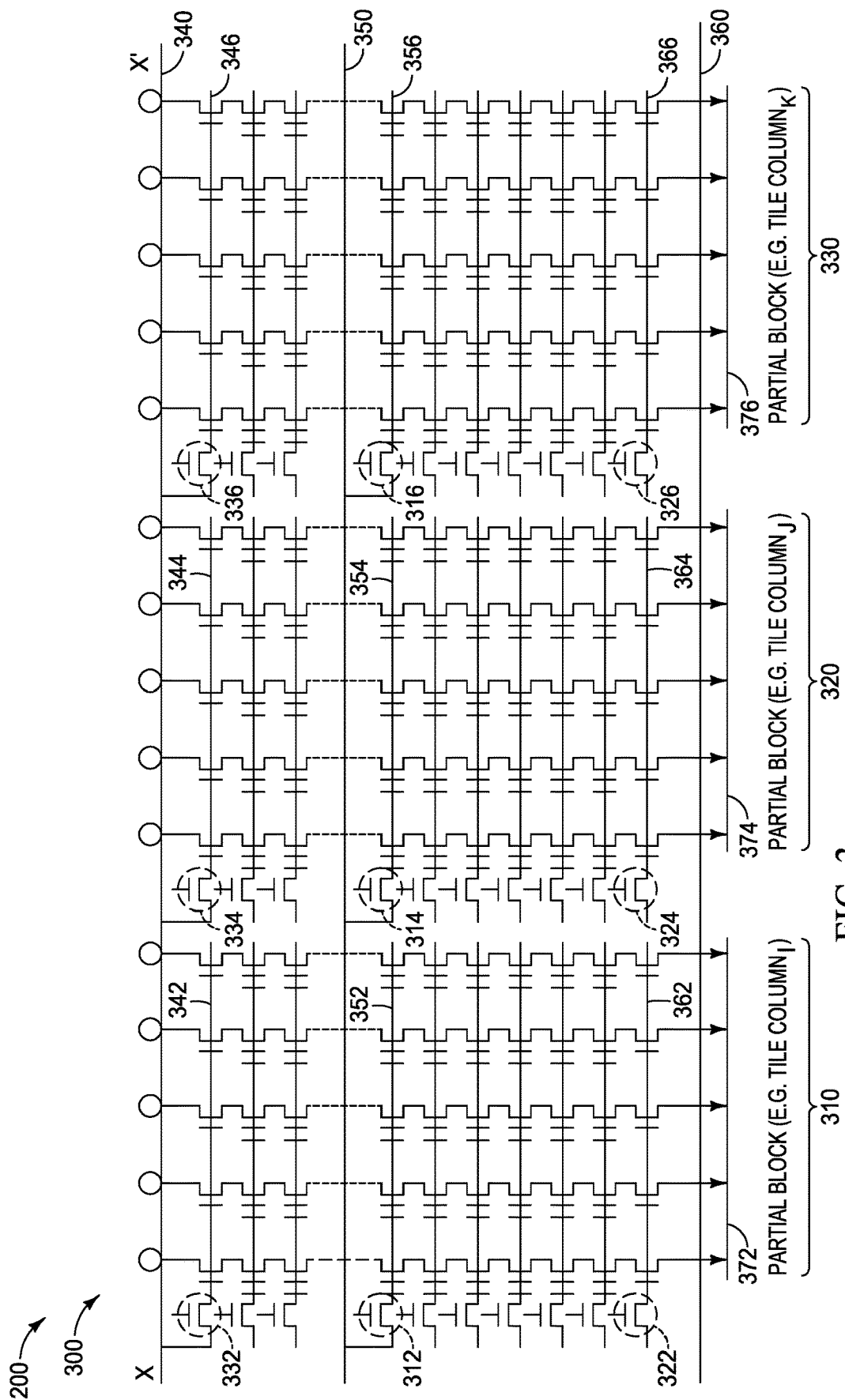
FIG. 3 shows a cross-sectional view of the prior art 3D NAND memory device of FIG. 2 in an X-X' direction.
Figure 4:
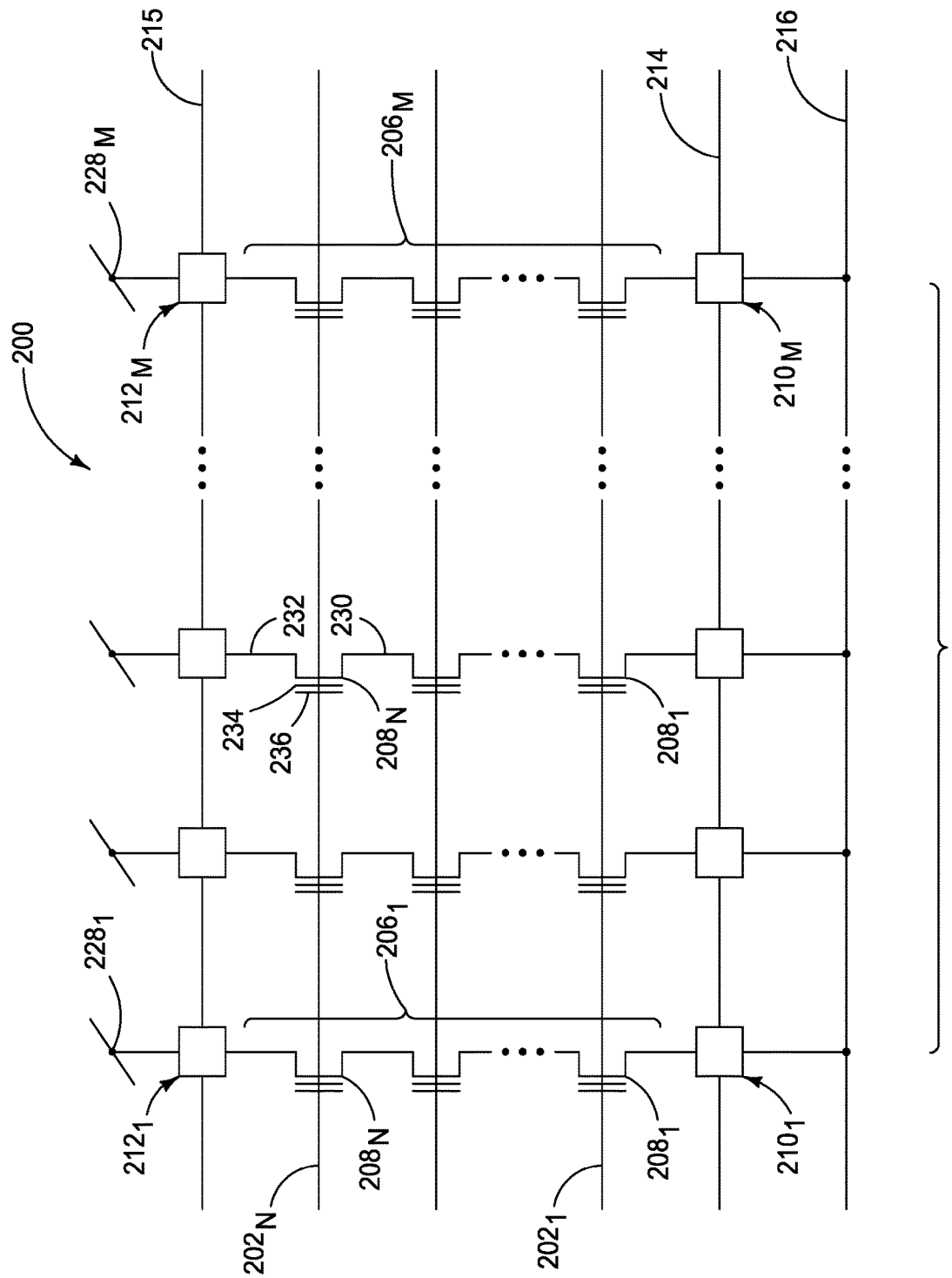
FIG. 4 is a schematic diagram of a prior art NAND memory array.
Figure 5:
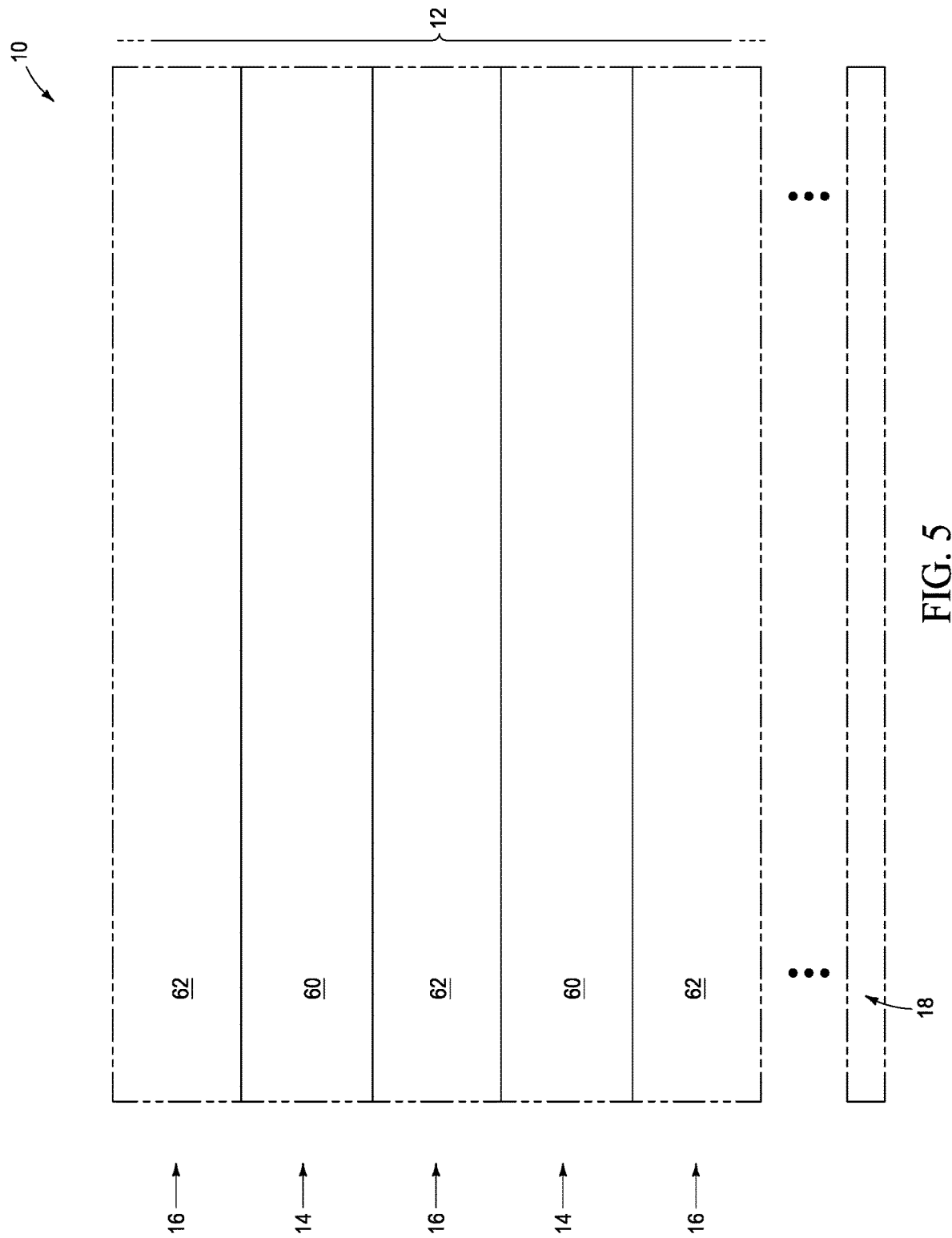

Referring to FIG. 5, a construction (integrated assembly, integrated structure) 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon dioxide; and the second material 62 may comprise, consist essentially of, or consist of silicon nitride. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have thicknesses within a range of from about 10 nm to about 50 nm.

The stack 12 is shown to be supported over a base 18. The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 18 to indicate that other components and materials may be provided between the stack 12 and the base 18. Such other components and materials may comprise additional levels of the stack, a source line level, source-side select gates (SGSs), etc.

Figure 6A:
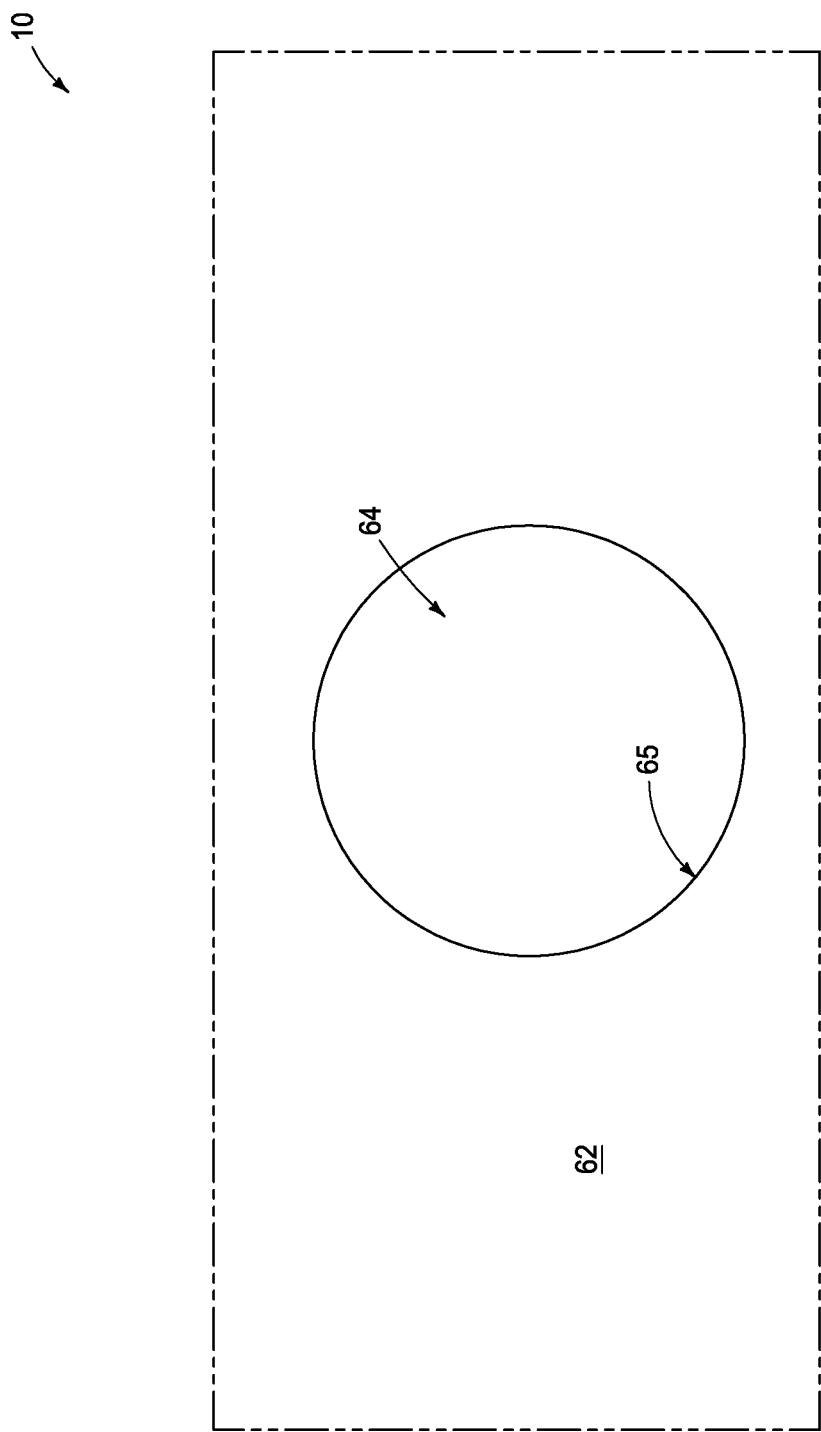
FIG. 6A is a diagrammatic top view of a portion of the integrated assembly of FIG. 6.

Referring to FIG. 6, an opening 64 is formed to extend through the stack 12. The opening 64 has sidewalls 65 extending along the first and second materials 60 and 62. The opening 64 may have a closed shape (circular, elliptical, polygonal, etc.) when viewed from above (as shown in FIG. 6A), and the sidewalls 65 shown in the cross-section of FIG. 6 may be part of a single continuous sidewall that extends around the closed shape of the opening 64 (as shown in FIG. 6A). The opening 64 may be representative of a large number of substantially identical openings formed at the process stage of FIG. 6 and utilized for fabricating NAND memory cells of a NAND memory array. The term "substantially identical" means identical to within reasonable tolerances of fabrication and measurement.

Figure 7:
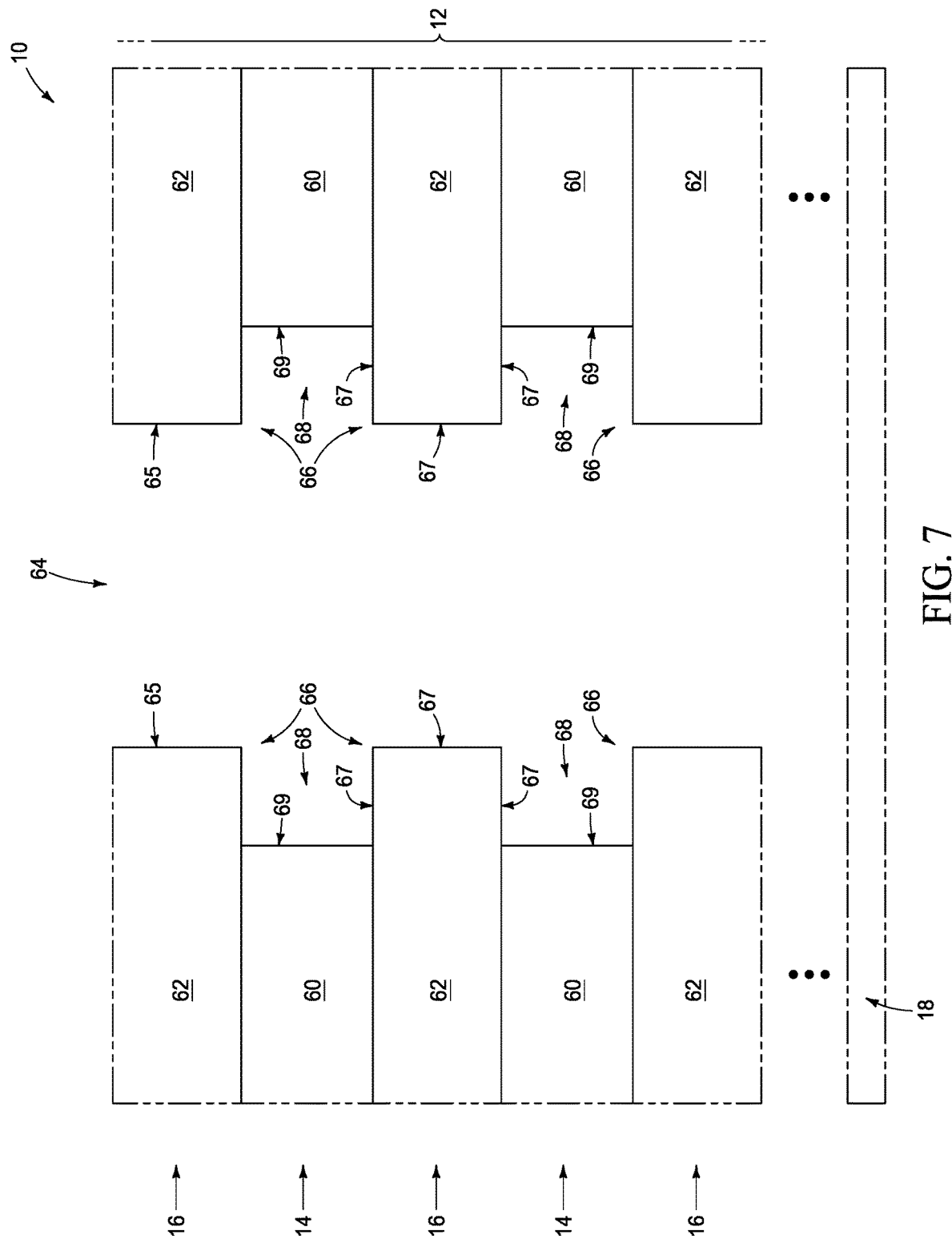
FIGS. 7-15 are diagrammatic cross-sectional side views of the region of the integrated assembly of FIG. 5 shown at example sequential process stages of an example method for forming an example NAND memory array. The process stage of FIG. 7 follows the process stage of FIG. 6.

Referring to FIG. 7, the first levels 14 are recessed relative to the second levels 16 along the sidewalls 65 of the opening 64. After the recessing, the second levels 16 have projecting terminal ends 66 which extend beyond the recessed first levels 14. The terminal ends 66 have surfaces 67 of the second material 62. The recessed first levels 14 have surfaces 69 of the first material 60. Cavities (gaps) 68 are vertically between the terminal ends 66. The surfaces 69 may be considered to be along inner edges of the cavities 68.

The surfaces 67 and 69 together form an undulating sidewall surface 65 of the opening 64 at the process stage of FIG. 7. The undulating sidewall surface 65 of FIG. 7 may be referred to as a first undulating sidewall surface.

Figure 8:
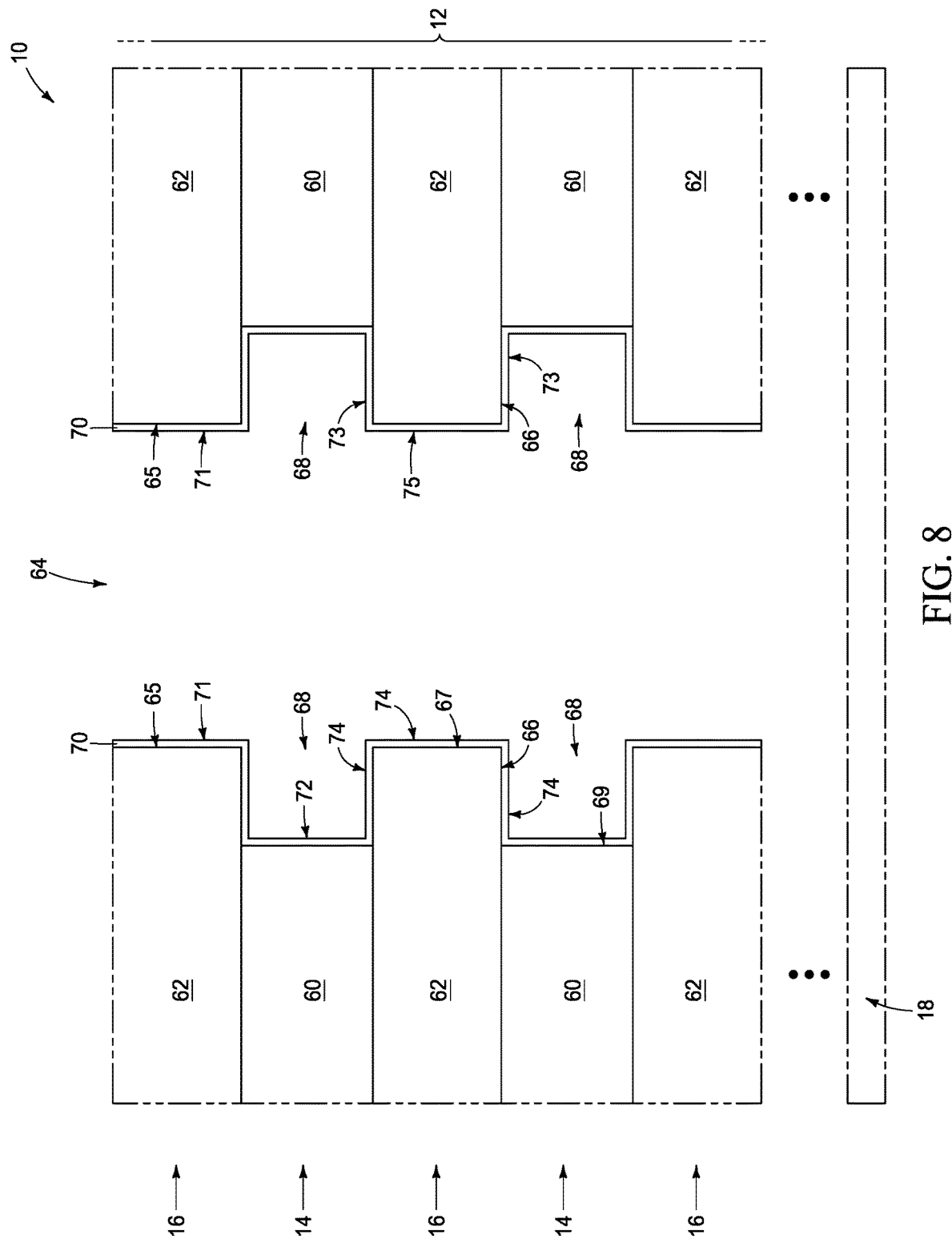

Referring to FIG. 8, dielectric material 70 is formed along the undulating sidewall surface 65. The dielectric material 70 may comprise any suitable composition(s). In some embodiments, the dielectric material 70 may comprise silicon dioxide. In some embodiments, the dielectric material 70 may be a high-k dielectric material. The term "high-k" means a dielectric constant greater than that of silicon dioxide. In some embodiments, the dielectric material 70 may be a high-k dielectric material comprising, consisting essentially of, or consisting of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries.

The dielectric material 70 has a substantially uniform thickness along the entirety of the undulating sidewall 65; with the term "substantially uniform" meaning uniform to within reasonable tolerances of fabrication and measurement. The dielectric material 70 may be formed to any suitable thickness; and in some embodiments may be formed to a thickness within a range of from about 1 nanometer (nm) to about 6 nm.

The dielectric material 70 wraps around the terminal ends 66. In the illustrated embodiment, the terminal ends 66 have substantially square corners, and the dielectric material 70 extends around such substantially square corners. In other embodiments the corners may be more rounded.

The dielectric material 70 may be considered to have first portions 72 along the first material 60 (i.e., along the surfaces 69), and to have second portions 74 along the second material 62 (i.e., along the surfaces 67). The second portions 74 have substantially horizontal segments 73 along upper and lower surfaces of the terminal ends 66, and have substantially vertical segments 75 along front surfaces (i.e. sidewall surfaces) of the terminal ends 66. The substantially vertical segments 75 extend between the substantially horizontal segments 73. The term "substantially vertical" means vertical to within reasonable tolerances of fabrication and measurement; and the term "substantially horizontal" means horizontal to within reasonable tolerances of fabrication and measurement.

The dielectric material 70 has an outer surface 71 having an undulating topography. The outer surface 71 of the dielectric material 70 may be considered to be a second undulating sidewall surface of the opening 64, with such second undulating sidewall surface being formed over the first undulating sidewall surface 65.

Figure 9:
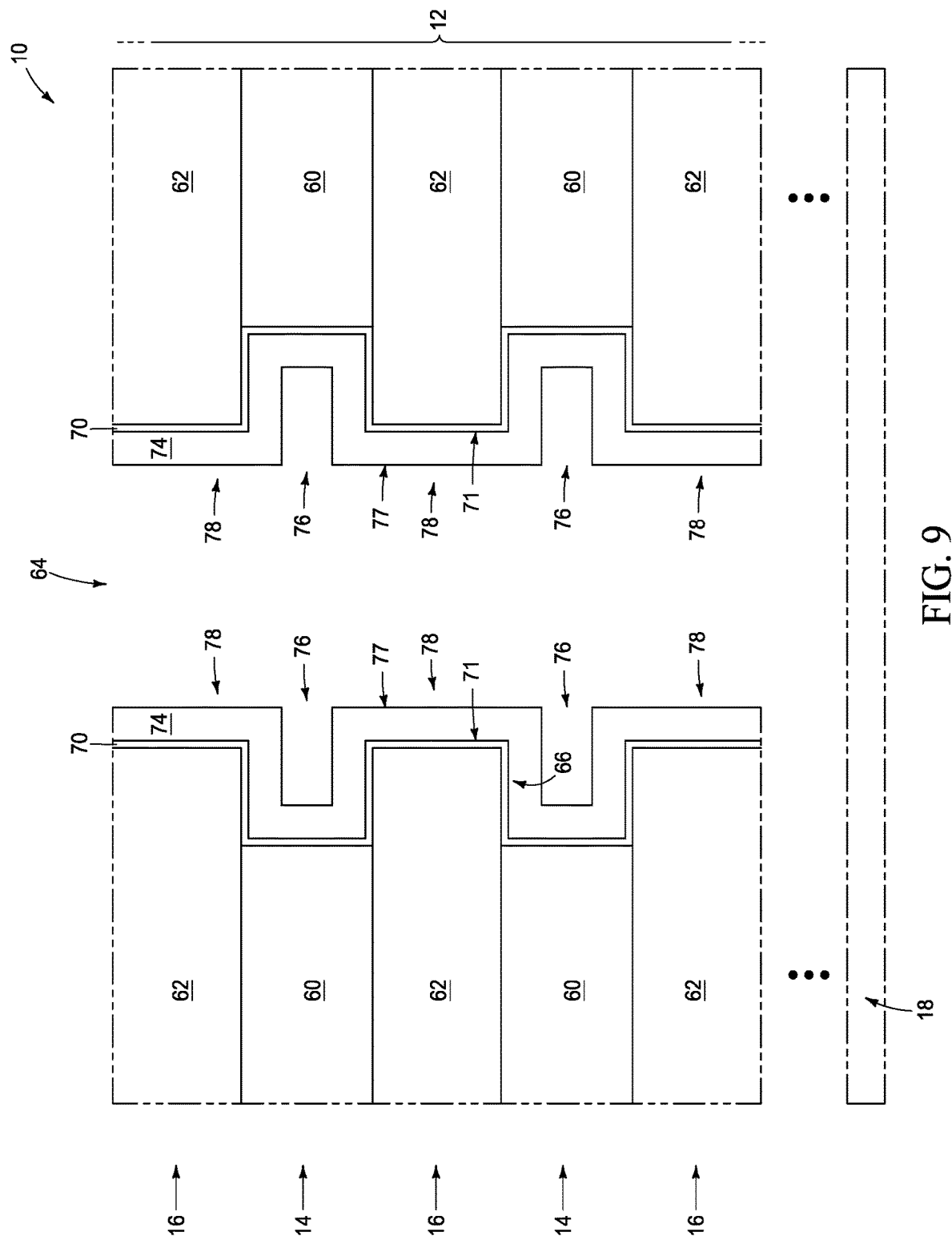

Referring to FIG. 9, a material 74 is formed adjacent to the dielectric material 70 and along the second undulating surface 71. The material 74 may be referred to as a third material to distinguish it from the first and second materials 60 and 62. The third material 74 has an undulating topography, which may be considered to be a third undulating sidewall surface 77 of the opening 64. The third undulating sidewall surface has peak regions 78 along the second levels 16, and has valley regions (or cavities) 76 along the first levels 14.

The third material 74 may comprise any suitable composition(s). For instance, in some embodiments the third material may comprise, consist essentially of, or consist of silicon nitride or silicon (e.g., polycrystalline silicon).

Figure 10:
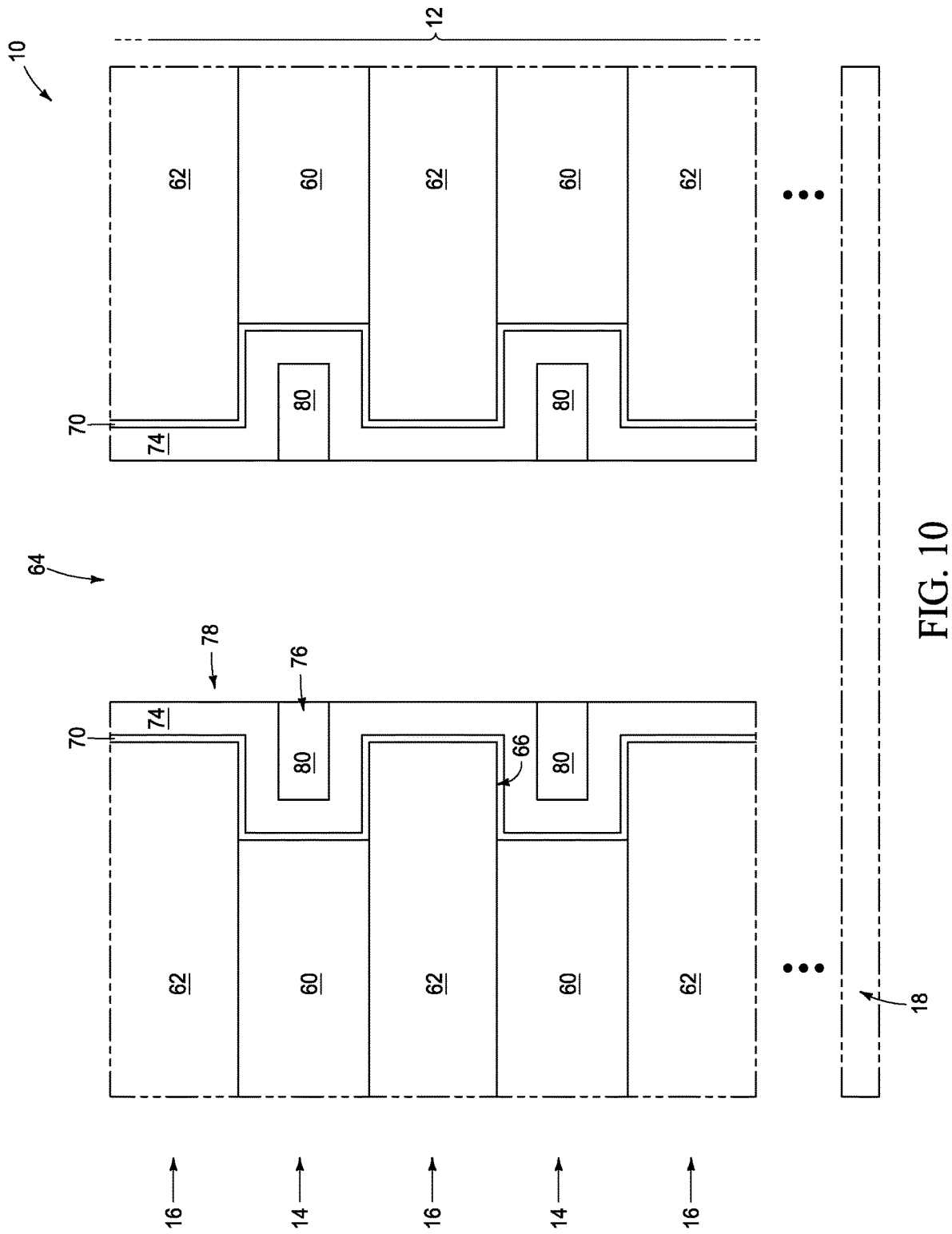

Referring to FIG. 10, a material 80 is formed within the cavities 76. The material 80 may be referred to as a fourth material to distinguish it from the first, second and third materials 60, 62 and 74. The fourth material may comprise any suitable composition(s); and in some embodiments may comprise, consist essentially of, or consist of silicon dioxide.

Figure 11:
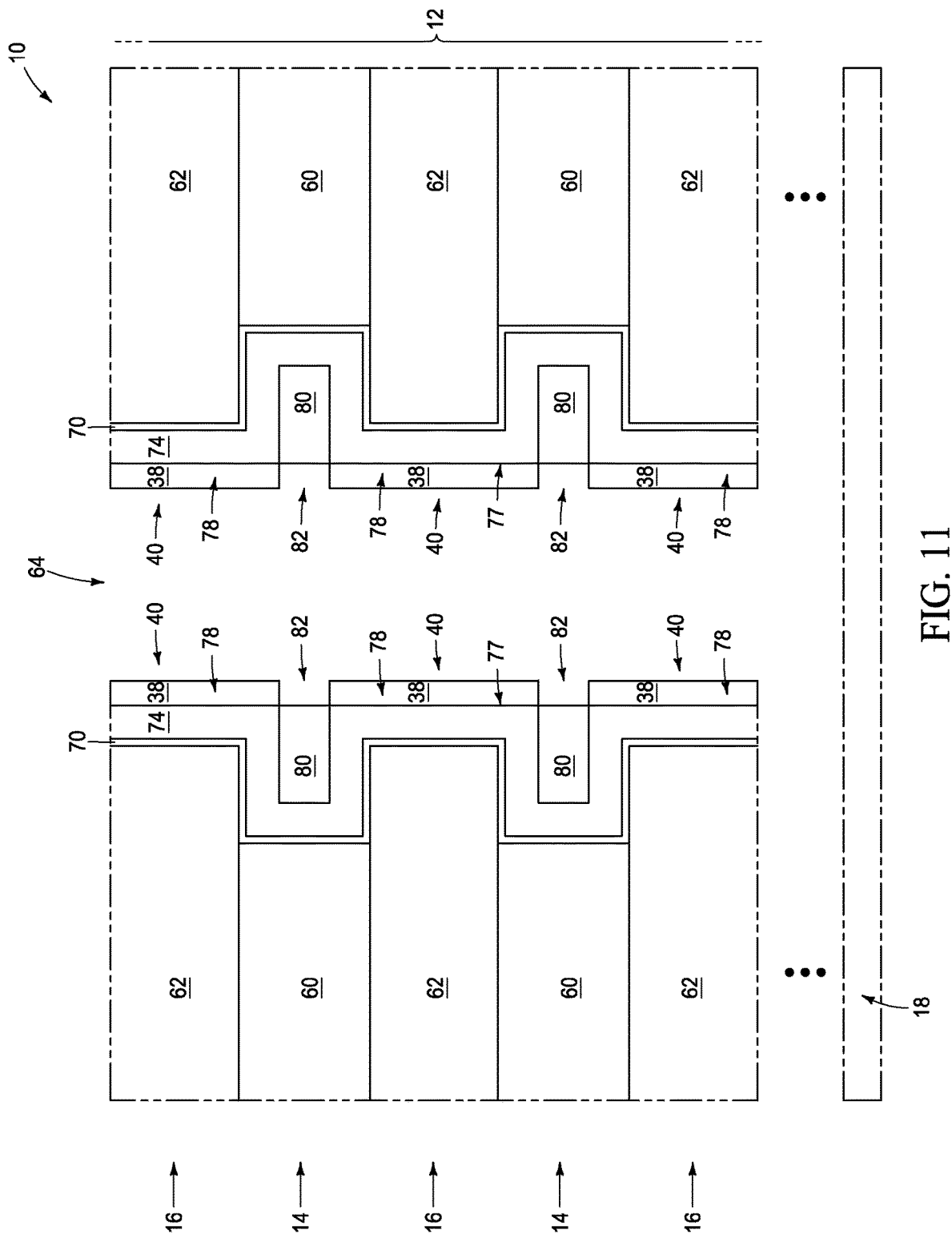

Referring to FIG. 11, charge-storage material 38 is selectively formed to be along the third material 74 relative to the fourth material 80. Accordingly, the charge-storage material 38 is formed in vertically-stacked segments 40. The segments 40 are along the peak regions 78 of the surface 77. The segments 40 are vertically spaced from one another by gaps 82 adjacent the fourth material 80.

The charge-storage material 38 may comprise any suitable composition(s). In some embodiments the charge-storage material 38 may comprise charge-trapping materials; such as, for example, silicon nitride, silicon oxynitride, conductive nanodots, etc. For instance, in some embodiments the charge-storage material 38 may comprise, consist essentially of, or consist of silicon nitride. In alternative embodiments, the charge-storage material 38 may be configured to include floating gate material (such as, for example, polycrystalline silicon).

Each of the segments 40 of the charge-storage material 38 has a flat configuration (or a substantially flat configuration) in the illustrated embodiment of FIG. 11. The term "flat configuration" means that the material 38 of the segments 40 is of substantially continuous thickness and extends substantially vertically straight, as opposed to being undulating. The term "substantially flat" means flat to within reasonable tolerances of fabrication and measurement.

The charge-storage material 38 may be selectively formed along the third material 74 relative to the fourth material 80 utilizing any suitable processing. In some embodiments, a hindering material (also referred to herein as a poisoning material) may be selectively formed along the fourth material 80 relative to the third material 74 to preclude subsequent formation of the charge-storage material 38 along surfaces of the fourth material 80, and then the charge-storage material 38 may be formed by a suitable deposition process (e.g., atomic layer deposition, chemical vapor deposition, etc.). The hindering material may comprise any suitable composition(s); and in some embodiments may comprise one or more of N,N dimethylaminotrimethylsilane, bis(N,N-dimethylamino)dimethylsilane, ethylenediamine, 1-trimethylsilylpyrrolidine, 1-trimethylsilylpyrrole, 3,5-dimethyl-1-trimethylsilyl, and R1-(C—OH)—R2; where R1 and R2 are organic moieties.

Figure 12:
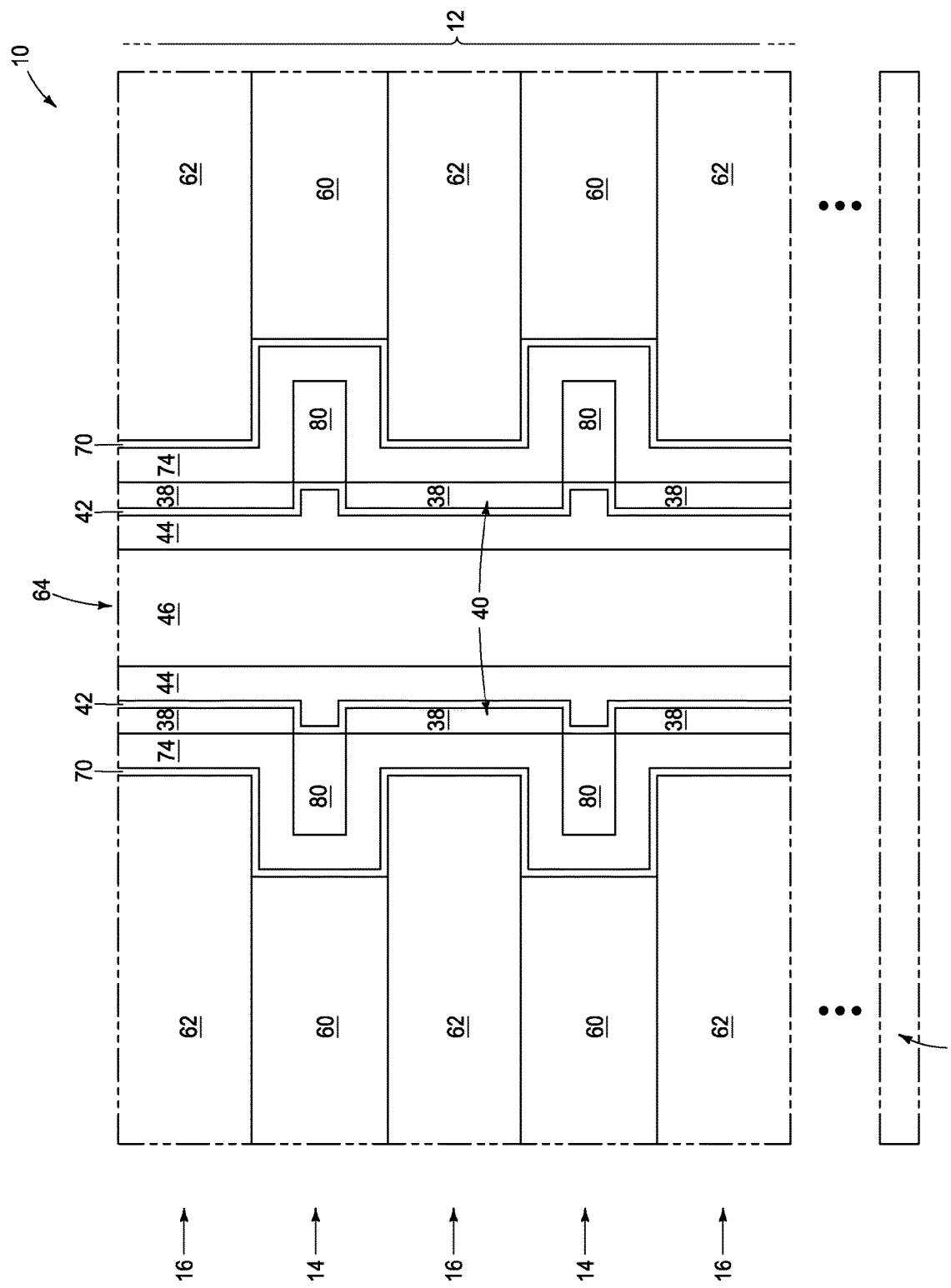

Referring to FIG. 12, tunneling material (i.e., gate-dielectric material, charge-passage material) 42 is formed adjacent the charge-storage material 38, channel material 44 is formed adjacent the tunneling material, and insulative material 46 is formed adjacent the channel material.

The tunneling material 42 may comprise any suitable composition(s). In some embodiments, the tunneling material 42 may comprise, for example, one or more of silicon dioxide, silicon nitride, silicon oxynitride, aluminum oxide, hafnium oxide, zirconium oxide, etc. The tunneling material 42 may be bandgap-engineered to achieve desired electrical properties; and accordingly may comprise a combination of two or more different materials.

The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

The insulative material 46 may comprise any suitable composition(s); and in some embodiments may comprise, consist essentially of, or consist of silicon dioxide.

In the illustrated embodiment of FIG. 12, the channel material 44 is configured as an annular ring which surrounds the insulative material 46. Such configuration of the channel material may be considered to comprise a hollow channel configuration, in that the insulative material 46 is provided within a "hollow" in the annular-ring-shaped channel configuration. In other embodiments (not shown), the channel material may be configured as a solid pillar configuration.

Figure 13:
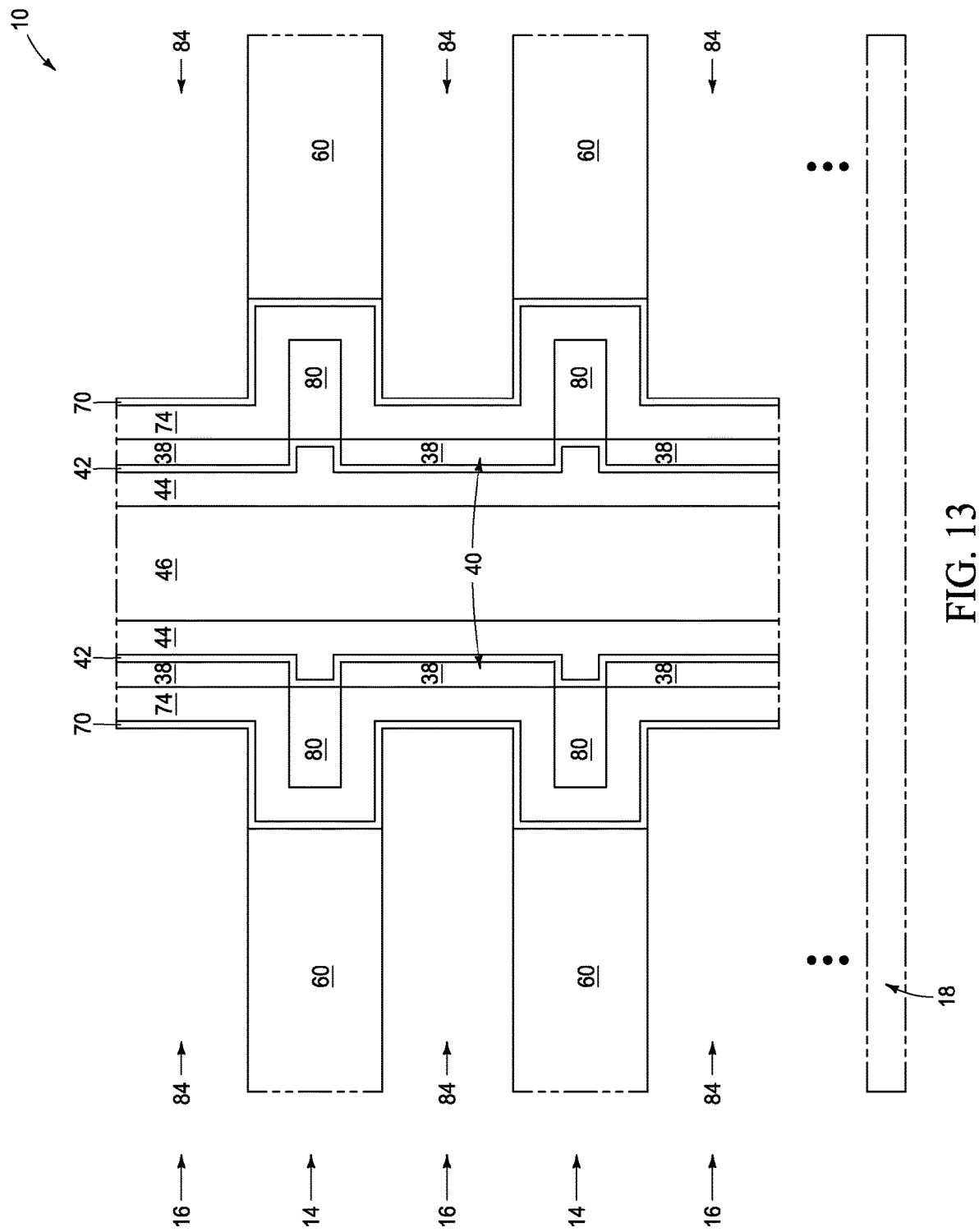

Referring to FIG. 13, the second material 62 (FIG. 12) is removed to leave voids 84. The voids 84 may be referred to as first voids to distinguish them from other voids which are formed at later process stages.

Figure 14:
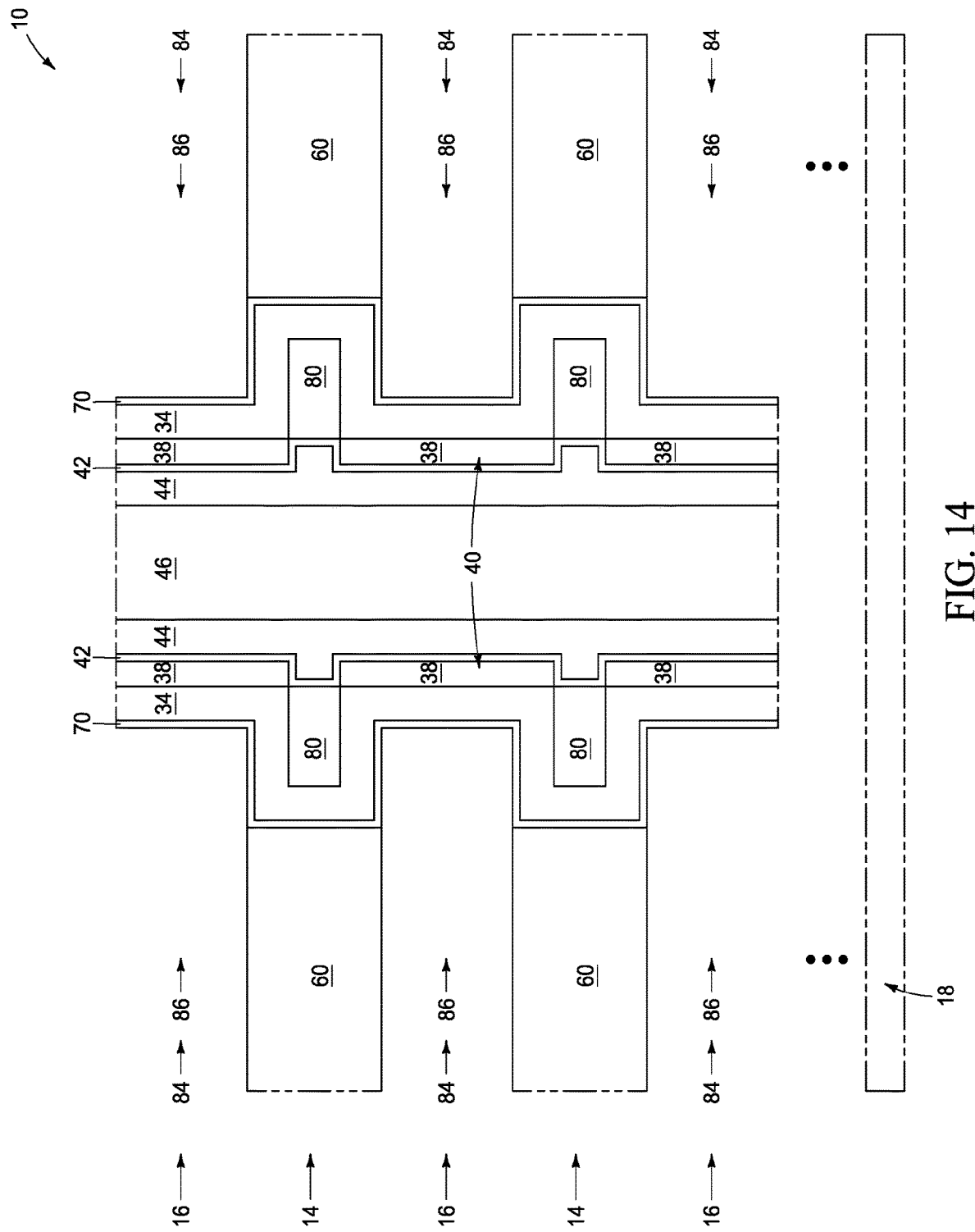

Referring to FIG. 14, the third material 74 (FIG. 13) is oxidized to convert the third material into charge-blocking material 34. The oxidation of the third material 74 may utilize oxidant 86 flowed into the voids 84. The oxidant 86 may include, for example, oxygen, ozone, etc.

The charge-blocking material 34 may comprise any suitable composition(s). For instance, if the third material 74 (FIG. 13) comprises silicon nitride, then the charge-blocking material 34 may comprise, consist essentially of, or consist of silicon oxynitride. As another example, if the third material 74 (FIG. 13) comprises silicon (e.g., polycrystalline silicon), then the charge-blocking material 34 may comprise, consist essentially of, or consist of silicon dioxide.

Figure 15:
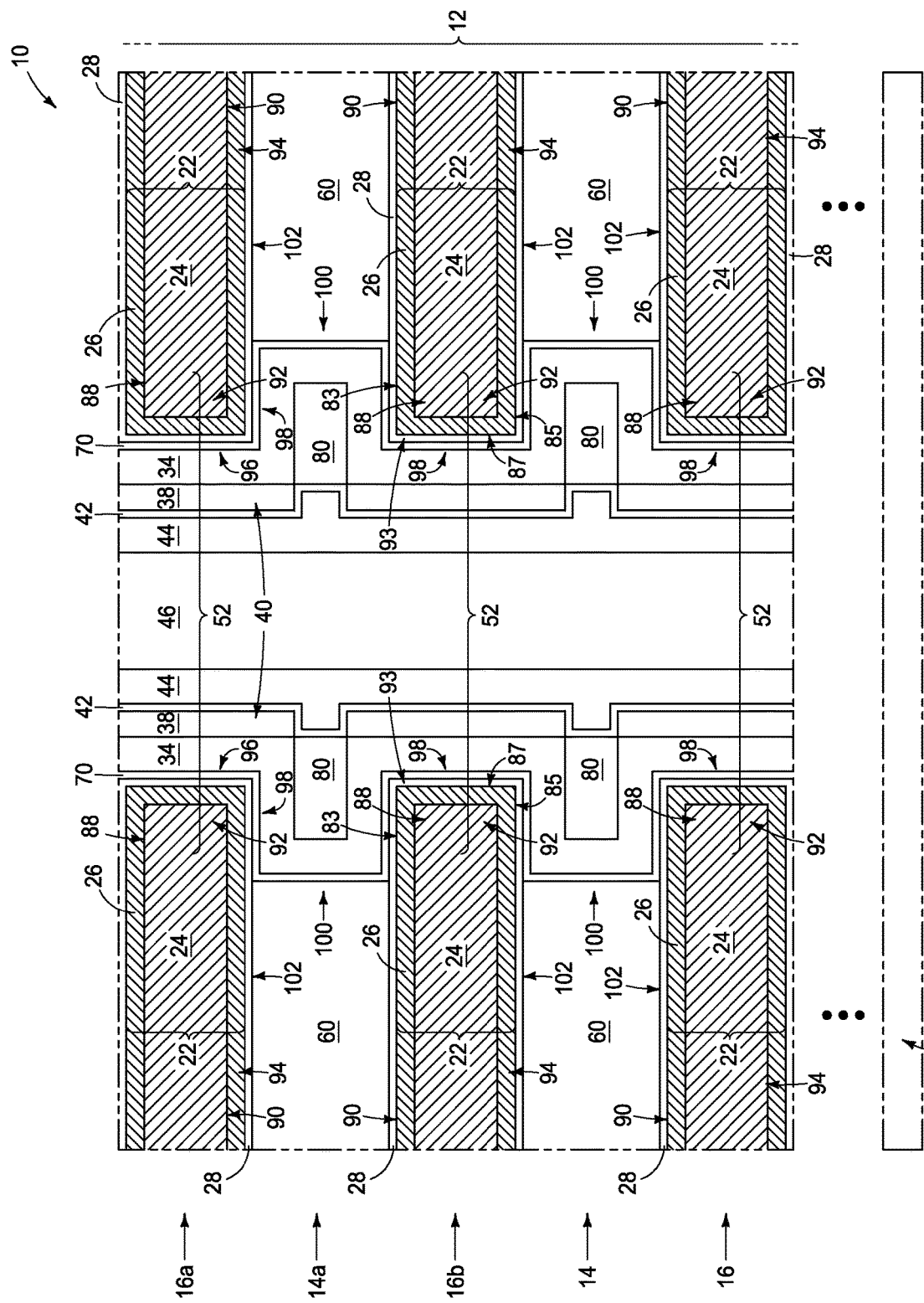

Referring to FIG. 15, high-k dielectric material 28 is formed within the first voids 84 (FIG. 14) to line the first voids, and then conductive regions 22 are formed within the lined voids.

The high-k dielectric material 28 may comprise, consist essentially of, or consist of one or more of aluminum oxide, hafnium oxide, hafnium silicate, zirconium oxide and zirconium silicate. In some embodiments, the materials 70 and 28 may both be high-k dielectric materials. In such embodiments, the materials 70 and 28 may comprise a same composition as one another, or may comprise different compositions relative to one another. If the materials 70 and 28 both comprise high-k dielectric material, one of the materials may be referred to as a first high-k dielectric material while the other is referred to as a second high-k dielectric material in order to distinguish the materials 70 and 28 from one another.

The high-k dielectric material 28 has a substantially uniform thickness along the interior peripheries of the voids 84 (FIG. 14). The high-k dielectric material 28 may be formed to any suitable thickness; and in some embodiments may be formed to a thickness within a range of from about 1 nm to about 5 nm.

The conductive regions 22 may comprise two or more conductive materials; and in the shown embodiment comprise a pair of conductive materials 24 and 26. The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 24 and 26 are compositionally different from one another. In some embodiments the core material 24 may comprise one or more metals (e.g., may comprise tungsten), and the outer conductive material 26 may comprise one or more metal nitrides (e.g., may comprise titanium nitride).

In the shown embodiment, the high-k dielectric material 28 is directly against the conductive material 26.

The levels 16 may be considered to be conductive levels (or wordline levels) at the processing stage of FIG. 15, with the conductive levels 16 comprising the conductive regions 22. In some embodiments, the configuration of FIG. 15 may be considered to have a vertical stack 12 of alternating conductive levels (NAND wordline levels) 16 and insulative levels 14.

The conductive regions 22 have terminal regions 88, and nonterminal regions 90 proximate the terminal regions. The terminal regions 88 are between the nonterminal regions 90 and the dielectric material 70. In some embodiments the dielectric material 70 may be considered to be adjacent to the terminal regions 88, and to not be adjacent to the nonterminal regions 90.

The conductive regions 22 of the wordline levels 16 include control gate regions 92 within the terminal regions 88, and include second regions (wordline regions) 94 proximate the control gate regions 92.

In some embodiments, the material 70 may be a high-k dielectric material which is adjacent to the terminal regions 88, and which extends vertically across the insulative levels 14. In some embodiments, the materials 28 and 70 may be together considered to be incorporated into high-k dielectric structures 96, with such structures being directly against the control gate regions 92, and extending across the insulative levels 14. If the materials 28 and 70 are a same composition is one another, the high-k dielectric material structures 96 will comprise a single homogeneous high-k material 28/70. If the materials 28 and 70 are different compositions relative to one another, then the high-k dielectric material structures 96 will comprise laminate regions (portions) 98 along the terminal regions 88 of the conductive levels 16, and will comprise non-laminate regions (portions) 100 along the insulative levels 14. In the illustrated embodiment, the laminate regions 98 comprise a laminate of two high-k dielectric materials 28 and 70. In other embodiments, the laminate may include more than two high-k dielectric materials (for instance, the material 70 may comprise two or more materials rather than the illustrated single material). The high-k dielectric materials of the laminate may be about the same thickness as one another (with the term "about the same" meaning the same to within reasonable tolerances of fabrication and measurement), as shown; or may comprise different thicknesses relative to one another.

The control gate regions 92 may be considered to comprise terminal ends 93 within the conductive levels 16. Each of the terminal ends 93 has a top surface 83, a bottom surface 85, and a sidewall surface (or front surface) 87 extending between the top and bottom surfaces. In the illustrated embodiment of FIG. 15, the laminate portions 98 of the high-k dielectric structures 96 wrap around the control gate regions 92; and specifically are along the top and bottom surfaces 83 and 85 of the terminal ends 93, as well as along the front surfaces 87 of the terminal ends 93.

In the embodiment of FIG. 15, the high-k dielectric structures 96 may be considered to have portions 98 along the control gate regions 92 of the conductive levels 16, and to have other portions 102 along the second regions 94 of the conductive levels 16. In some embodiments, the portions 98, 100 and 102 of the high-k dielectric structure 96 may be considered to be first, second and third portions of such high-k dielectric structures. The first portions 98 comprise a laminate of the materials 28 and 70, the second portions 100 comprise only the material 70, and the third portions 102 comprise only the material 28. Accordingly, the first portions 98 are thicker than the second and third portions 100 and 102. In some embodiments, the first portions 98 may be at least about double the thickness of the second and third portions 100 and 102.

In the illustrated embodiment of FIG. 15, the high-k dielectric structure 96 may be considered to directly contact terminal regions 88 of two of the conductive levels (e.g., conductive levels labeled 16a and 16b) which are vertically-neighboring with one another, and to extend entirely across one of the insulative levels (e.g., the insulative level labeled 14a) between the vertically-neighboring conductive levels.

NAND memory cells 52 comprise the dielectric barrier materials 28/70, the charge-blocking material 34, the charge-storage material 38, the gate-dielectric material 42 and the channel material 44. The illustrated NAND memory cells 52 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

The charge-storage material 38 within the memory cells 52 is configured as the segments 40 which are vertically stacked one atop another, and which are vertically spaced from one another. The tunneling material 42 and channel material 44 are configured as layers which extend vertically along (through) the stack 12.

Each of the NAND memory cells 52 includes a control gate region 92 within a conductive level 16. The control gate regions 92 comprise control gates analogous to those described above with reference to FIGS. 1-4.

In some embodiments, the high-k dielectric material 28 may be omitted. Instead, the material 70 may be the only high-k dielectric material within the NAND memory cells 52. An example of such embodiments is shown as an assembly 10a in FIG. 16. Notably, in the embodiment of FIG. 16 there is no high-k dielectric material extending along the nonterminal regions 90 of the conductive levels 16 (i.e., high-k dielectric material is not along the second regions 94 of the wordline levels 16), and the high-k dielectric structure 96 comprises a single homogeneous composition of uniform thickness along the levels 16 and 14 (i.e., there are no laminate portions analogous to the portions 98 of FIG. 15). The high-k dielectric material 70 of the assembly 10a of FIG. 16 directly contacts the conductive material 26 of the vertically-neighboring wordline levels 16a and 16b, and extends entirely across the insulative level 14a between the vertically-neighboring wordline levels 16a and 16b.

Figure 16:
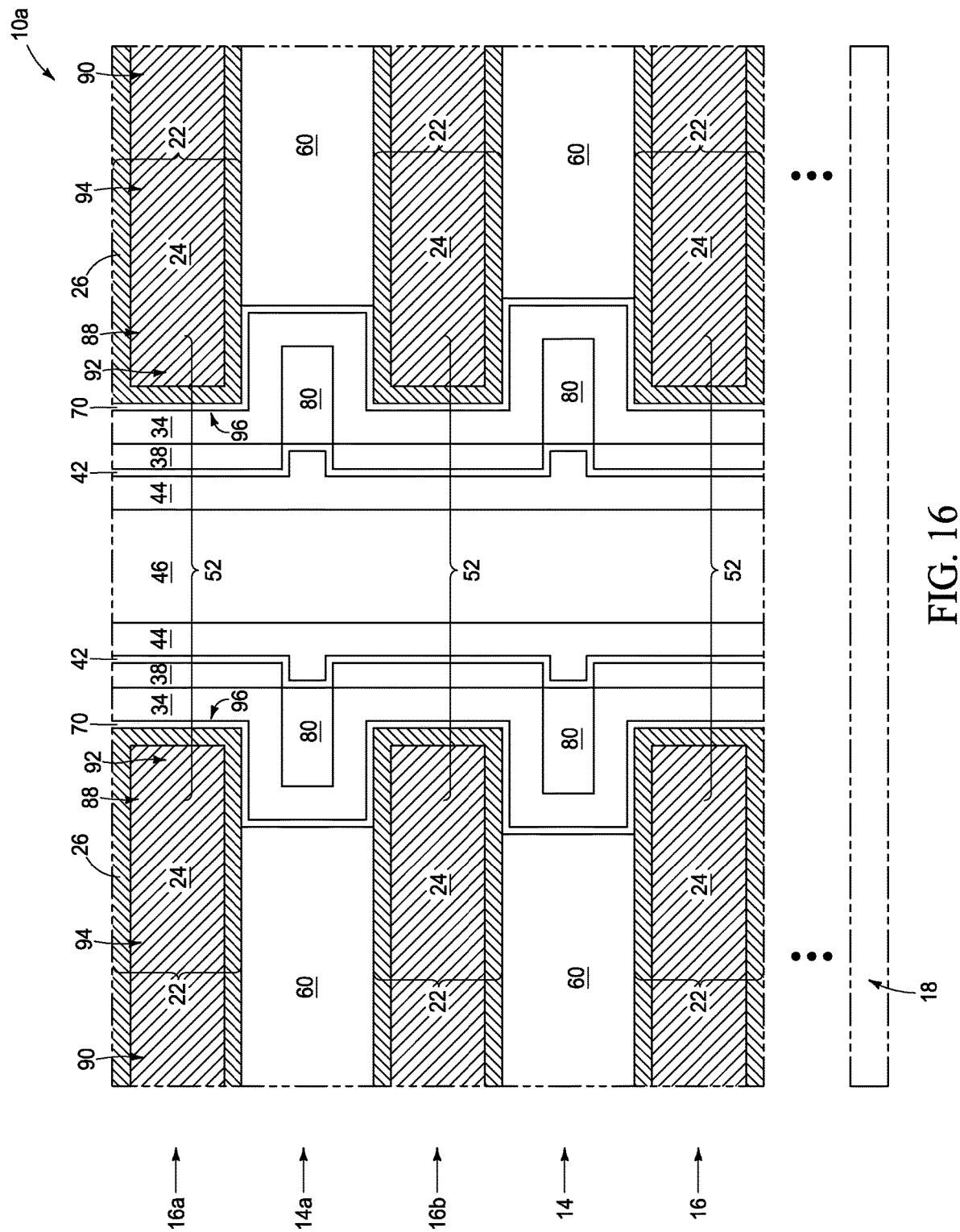
FIG. 16 is a diagrammatic cross-sectional side view of the region of the integrated assembly of FIG. 5 shown at an example process stage alternative to that of FIG. 15.

In the embodiments of FIGS. 15 and 16, the charge-blocking material 34 wraps around the terminal regions 88 of the conductive levels 16, and does not extend along the non-terminal regions 90. The charge-blocking material 34 extends vertically across the insulative levels 14.

Figure 17:
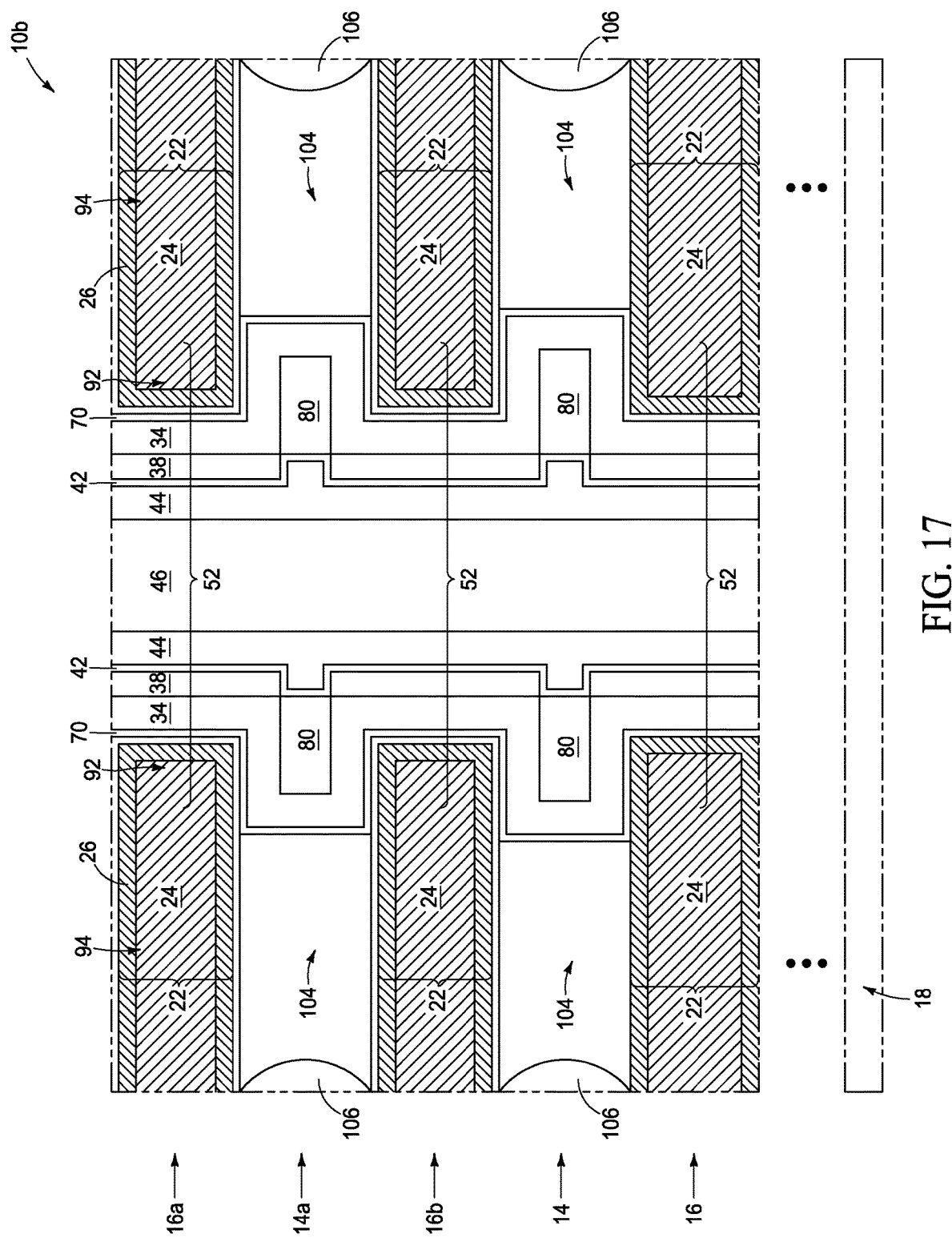
FIG. 17 is a diagrammatic cross-sectional side view of the region of the integrated assembly of FIG. 5 shown at another example process stage alternative to that of FIG. 15.

In the embodiment of FIGS. 15 and 16, the insulative levels 14 are entirely filled with the insulative materials 60, 70 and 80 in regions vertically between the conductive materials of levels 16. In other embodiments, voids may be formed within the insulative levels 14. For instance, FIG. 17 show an assembly 10b analogous to that of FIG. 15, but in which at least some of the insulative material 60 is replaced with voids 104. The voids 104 are capped with an insulative material 106. The voids 104 may be filled with air or any other suitable gas. The insulative material 106 may comprise any suitable composition(s); and in some embodiments may comprise, consist essentially of, or consist of silicon dioxide.

The voids 104 may be referred to as second voids to distinguish them from the first voids 84 described above with reference to FIG. 13.

An advantage of the configuration of FIG. 17 (i.e., a configuration having voids within the insulative levels 14) is that such may alleviate capacitive coupling between vertically-neighboring materials in the event that such capacitive coupling is found to be problematic.

Figure 18:
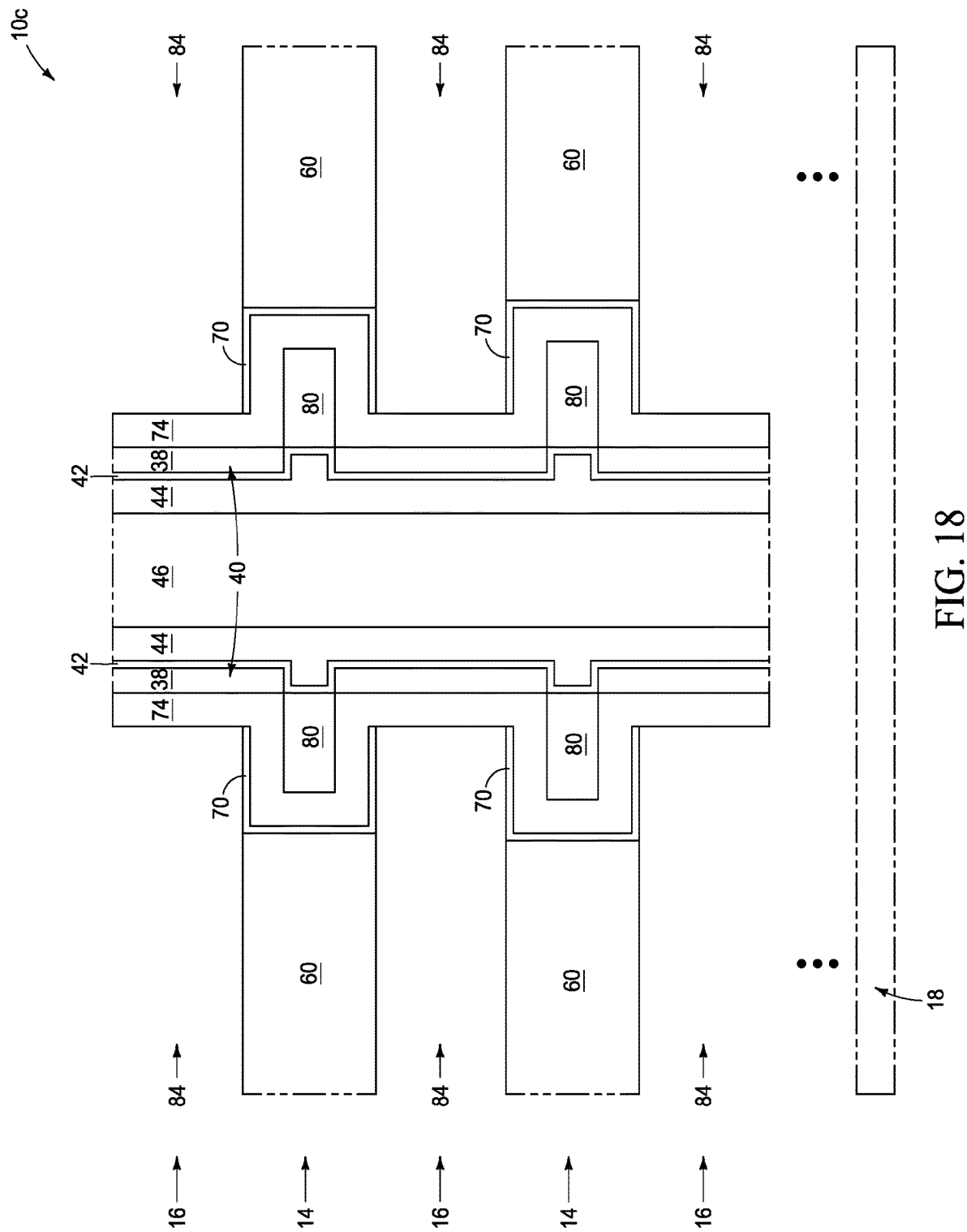
FIGS. 18-20 are diagrammatic cross-sectional side views of a region of an integrated assembly shown at example sequential process stages of an example method for forming an example NAND memory array. The process stage of FIG. 18 may follow that of FIG. 13.

In embodiments in which the material 70 comprises high-k dielectric material, it may be difficult to oxidize the third material 74 with oxidant flowed into the voids 84 at the processing stage of FIG. 14. In such embodiments, it may be advantageous to remove some of the material 70 prior to flowing the oxidant into the voids. FIG. 18 shows an assembly 10c at a process stage which may follow that of FIG. 13. Segments of the material 70 have been removed from ends of the voids 84.

Figure 19:
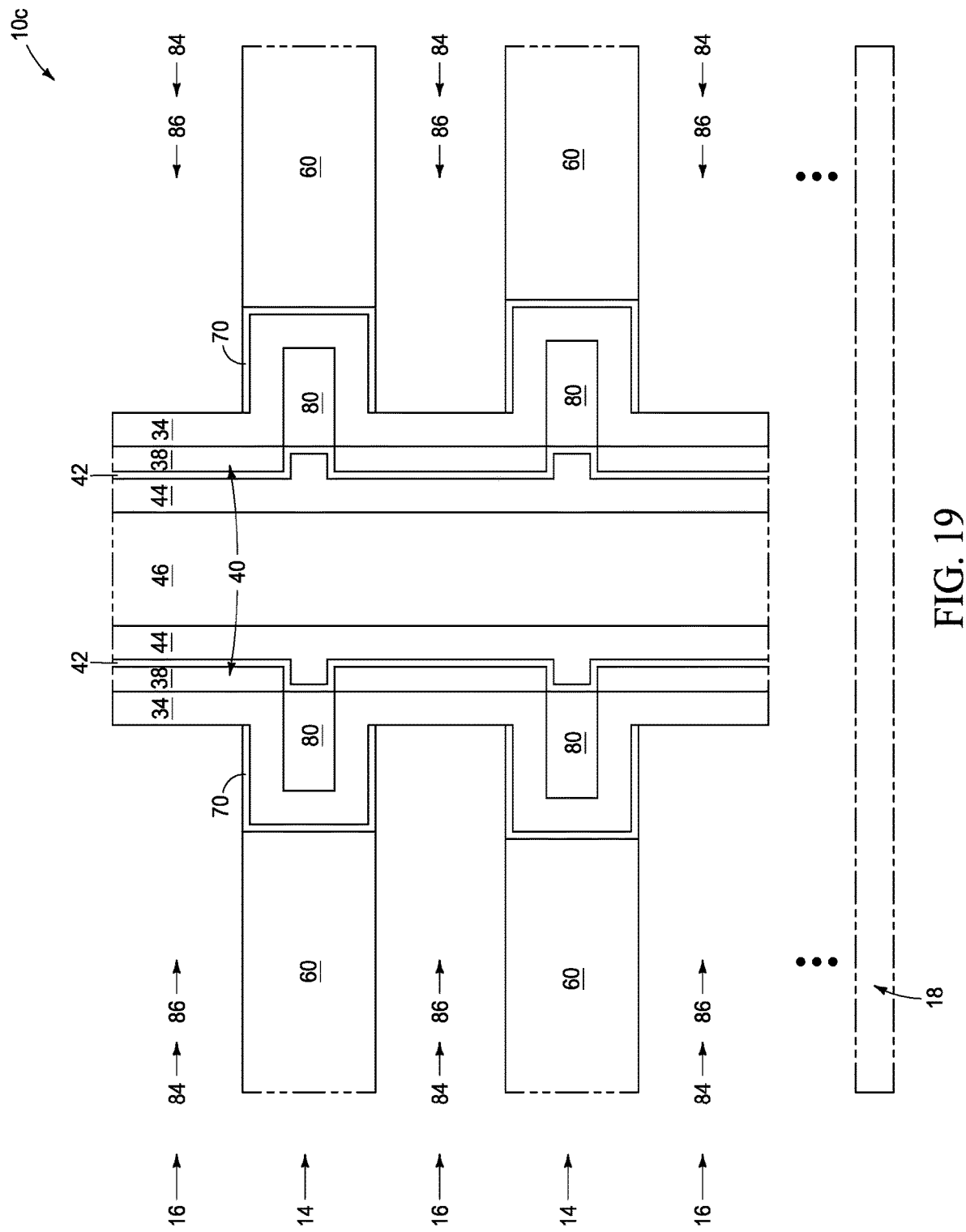

Referring to FIG. 19, the assembly 10c is shown at a process stage analogous to that of FIG. 14. The oxidant 86 is flowed into the voids 84, and is utilized to convert the third material 74 (FIG. 18) into the charge-blocking material 34. Although the entirety of the third material is shown to be converted to the charge-blocking material, it is to be understood that in some embodiments only portions of the third material may be converted into the charge-blocking material (e.g., there may be some portions of the third material remaining along the first levels 14 after the conversion of the third material to the charge-blocking material 34 along the second levels 16).

Figure 20:
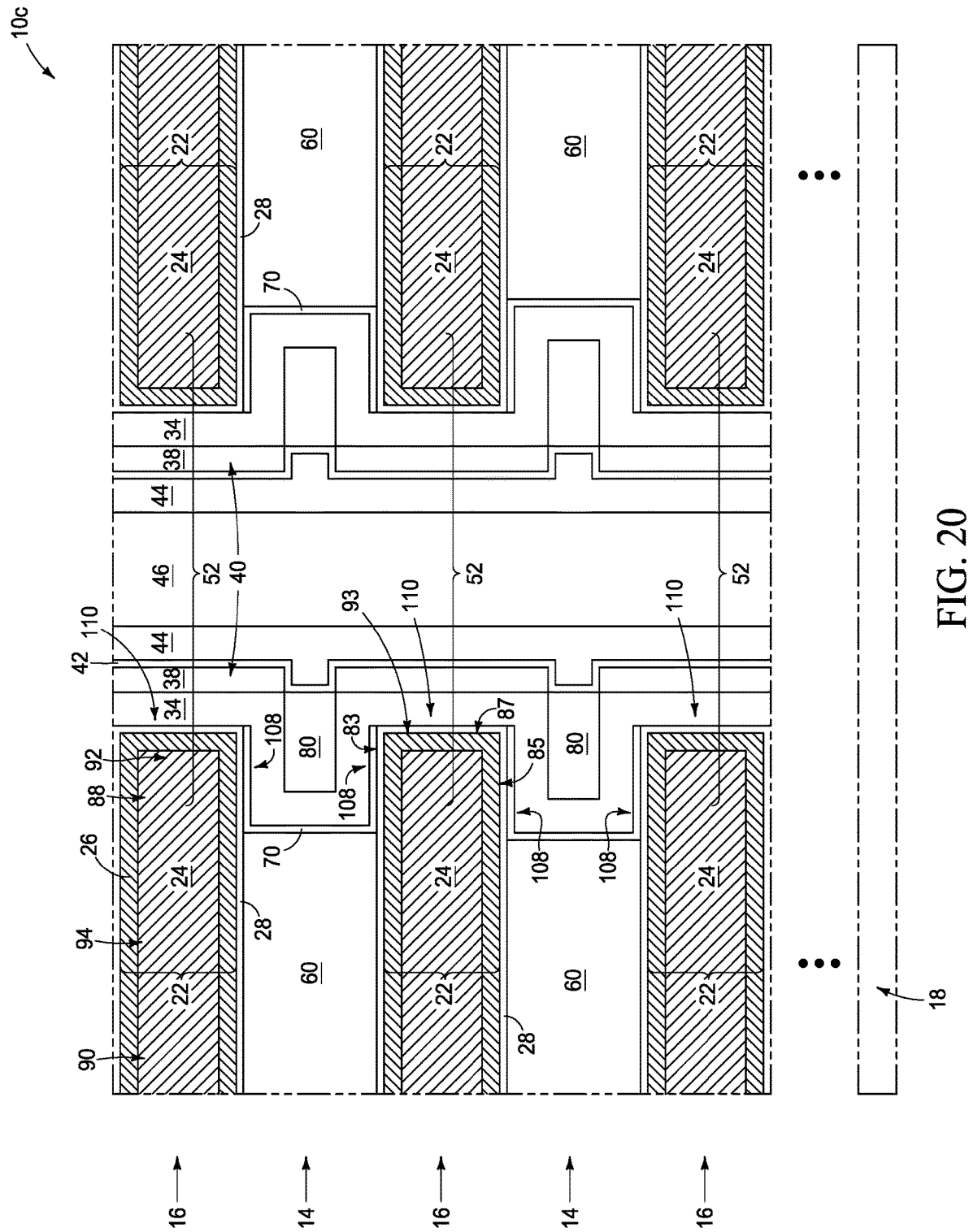

Referring to FIG. 20, the conductive regions 22 are formed within the voids 84 (FIG. 19). The assembly 10c of FIG. 20 has the second high-k dielectric material 28 extending along the top, bottom and sidewall surfaces 83, 85 and 87 of the terminal regions 88 of the conductive levels 16; and has the first high-k dielectric material 70 being only along the top and bottom surfaces 83 and 87 of the terminal regions 88. Further, the second dielectric material 28 extends along the nonterminal regions 90 of the conductive levels 16, while the first dielectric material 70 does not extend along such nonterminal regions. In some embodiments, the configuration of FIG. 20 be considered to comprise laminate high-k structures 108 along the top and bottom surfaces 83 and 85 of the terminal regions 88 (with the laminate comprising the first and second high-k dielectric materials 70 and 28), and to comprise non-laminate high-k structures 110 along the sidewall surfaces (front surfaces) 87 of the terminal regions 88, with such non-laminate high-k structures comprising the high-k dielectric material 28.

Figure 21:
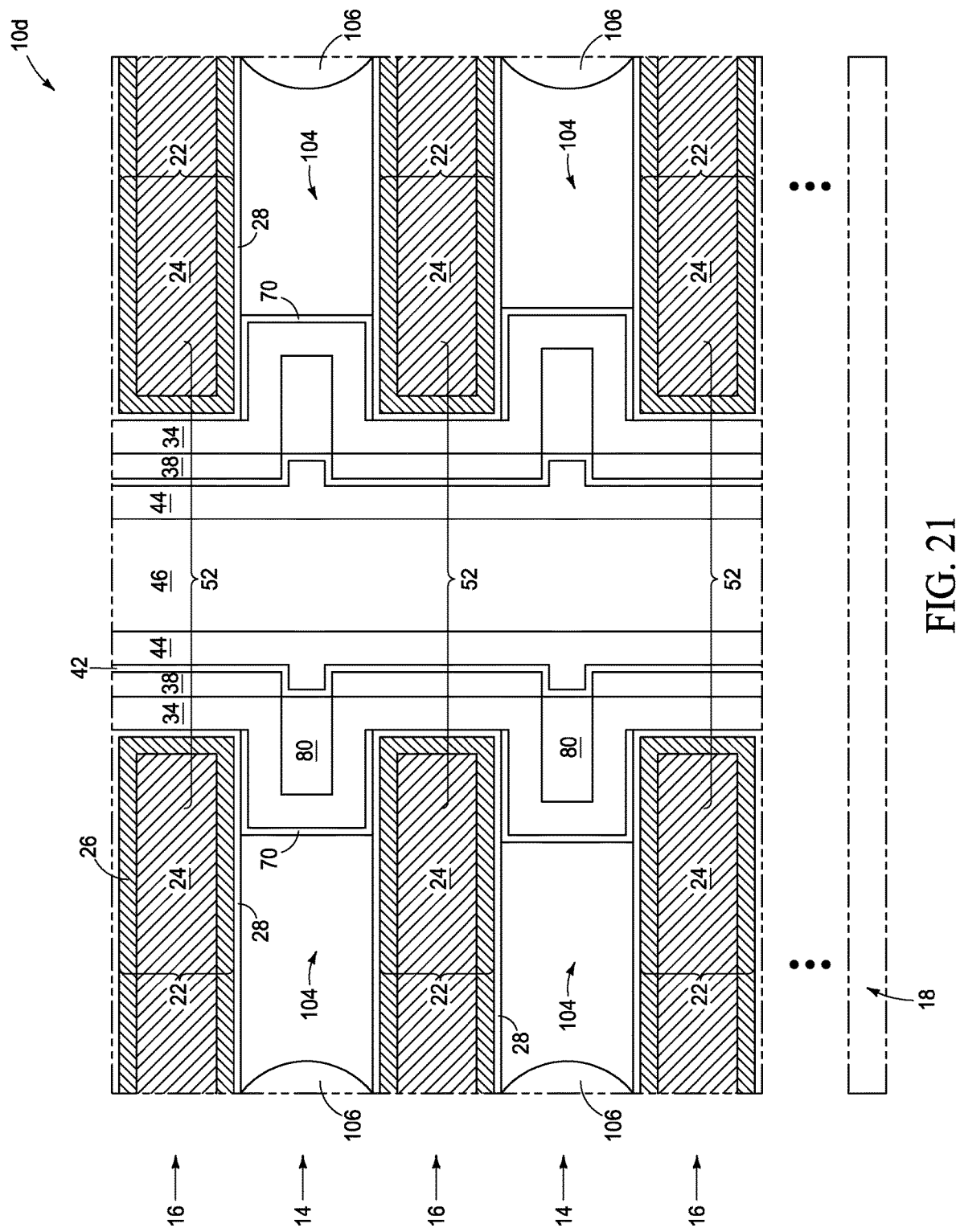
FIG. 21 is a diagrammatic cross-sectional side view of the region of the integrated assembly of FIG. 18 shown at an example process stage alternative to that of FIG. 20.

In some embodiments, at least some of the insulative material 60 of FIG. 20 may be replaced with voids. For instance, FIG. 21 shows an assembly 10d which is analogous to the assembly 10c of FIG. 20, but in which some of the insulative material 60 has been replaced with voids 104, and in which such voids are capped with insulative material 106. The voids 104 and insulative material 106 may be analogous to the voids 104 and insulative material 106 described above with reference to FIG. 17.

In operation, the charge-storage material 38 may be configured to store information in the memory cells 52 of the various embodiments described herein. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 92, and/or based on the value of voltage applied to the channel material 44.

The tunneling material 42 forms tunneling regions of the memory cells 52. Such tunneling regions may be configured to allow desired migration (e.g., transportation) of charge (e.g., electrons) between the charge-storage material 38 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 adjacent the charge-storage material 38 may provide a mechanism to block charge from flowing from the charge-storage material 38 to the associated gates 92.

The dielectric-barrier material (high-k material) 28, 70, or 28/70 provided between the charge-blocking material 34 and the associated gates 92 may be utilized to inhibit back-tunneling of charge carriers from the gates 92 toward the charge-storage material 38. In some embodiments, the dielectric-barrier material 28, 70 or 28/70 may be considered to form dielectric-barrier regions within the memory cells 52.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure having a vertical stack of alternating insulative levels and conductive levels. The conductive levels have terminal regions, and have nonterminal regions proximate the terminal regions. High-k dielectric material is adjacent to the terminal regions and extends vertically across the insulative levels. Charge-blocking material is adjacent to the terminal regions. Charge-storage material is arranged in vertically-stacked spaced-apart segments. The segments are adjacent to the charge-blocking material. Gate-dielectric material is adjacent to the charge-storage material. Channel material is adjacent to the gate-dielectric material.

Some embodiments include a NAND memory array having a vertical stack of alternating insulative levels and conductive levels. The conductive levels include control gate regions and second regions proximate the control gate regions. High-k dielectric structures are directly against the control gate regions and extend entirely across the insulative levels. Charge-blocking material is adjacent to the high-k dielectric structures. Charge-storage material is adjacent to the charge-blocking material. The charge-storage material is configured as segments which are vertically stacked one atop another, and which are vertically spaced from one another. Gate-dielectric material is adjacent to the charge-storage material. Channel material extends vertically along the stack and is adjacent to the gate-dielectric material.

Some embodiments include a method of forming an integrated structure. A vertical stack of alternating first and second levels is formed. The first levels comprise first material and the second levels comprise second material. An opening is formed to extend through the stack. The first levels are recessed relative to the second levels. The second levels have terminal ends which extend beyond the recessed first levels. The terminal ends have surfaces of the second material. The recessed first levels have surfaces of the first material. The surfaces of the first and second materials form a first undulating sidewall surface of the opening. Dielectric material is formed along the undulating sidewall surface. The dielectric material wraps around the terminal ends. The dielectric material has first portions along the surfaces of the first material, and has second portions along the surfaces of the second material. An outer surface of the dielectric material is a second undulating sidewall surface of the opening. Third material is formed to be adjacent to the dielectric material and along the second undulating sidewall surface. An outer surface of the third material is a third undulating sidewall surface of the opening. The third undulating sidewall surface has peak regions along the second levels, and has cavities along the first levels. A fourth material is formed within the cavities. Charge-storage material is selectively formed along the third material relative to the fourth material to form segments of the charge-storage material along the peak regions. The segments are vertically spaced from one another by gaps adjacent to the fourth material. Tunneling material is formed adjacent to the charge-storage material. Channel material is formed adjacent to the tunneling material. The second material is removed to leave voids. The third material is oxidized with oxidant flowed into the voids. The oxidation forms charge-blocking material from the third material. Conductive levels are formed within the voids. The conductive levels have terminal regions adjacent to the dielectric material, and have nonterminal regions proximate the terminal regions. The dielectric material is adjacent to the terminal regions and is not adjacent to the nonterminal regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
   a vertical stack of alternating insulative levels and conductive levels;
   the conductive levels having terminal regions, and having nonterminal regions proximate the terminal regions;
   high-k dielectric material adjacent the terminal regions and extending vertically across the insulative levels;
   charge-blocking material adjacent the terminal regions;
   charge-storage material arranged in vertically-stacked spaced-apart segments; the segments being adjacent the charge-blocking material and laterally spaced from the conductive levels, a portion of the segments extending past the conductive levels to be laterally spaced from the insulative levels;
   gate-dielectric material adjacent the charge-storage material;
   channel material adjacent the gate-dielectric material; and
   wherein the high-k dielectric material directly contacts terminal regions of two of the conductive levels which are vertically-neighboring with one another, and extends entirely across one of the insulative levels between the vertically-neighboring conductive levels.

2. The integrated structure of claim 1 wherein the high-k dielectric material comprises one or more of aluminum oxide, hafnium oxide, hafnium silicate, zirconium oxide and zirconium silicate.

3. The integrated structure of claim 1 wherein the charge-blocking material wraps around the terminal regions of the conductive levels and does not extend along the nonterminal regions; and wherein the charge-blocking material extends vertically across the insulative levels.

4. The integrated structure of claim 1 wherein the high-k dielectric material wraps around the terminal regions; wherein the terminal regions have top surfaces and bottom surfaces, and have vertically-extending sidewall surfaces between the top surfaces and the bottom surfaces; and wherein the high-k dielectric material extends along the top surfaces, the bottom surfaces and the sidewall surfaces of the terminal regions, and is not along the nonterminal regions.

5. The integrated structure of claim 1 wherein at least portions of the high-k dielectric material comprise a laminate of two or more different high-k dielectric materials.

6. A NAND memory array, comprising:
a vertical stack of alternating insulative levels and conductive levels;
the conductive levels including control gate regions and second regions proximate the control gate regions;
high-k dielectric structures directly against the control gate regions and extending entirely across the insulative levels;
charge-blocking material adjacent the high-k dielectric structures;
charge-storage material adjacent the charge-blocking material; the charge-storage material being configured as segments which are vertically stacked one atop another, and which are vertically spaced from one another;
gate-dielectric material adjacent the charge-storage material;
channel material extending vertically along the stack and being adjacent the gate-dielectric material; and
wherein at least portions of the high-k dielectric structures comprise a laminate of two or more different high-k dielectric materials.

7. The NAND memory array of claim 6 wherein the high-k dielectric structures comprise one or more of aluminum oxide hafnium oxide, hafnium silicate, zirconium oxide and zirconium silicate.

8. The NAND memory array of claim 6 wherein the high-k dielectric structures comprise only a single homogenous high-k dielectric material.

9. The NAND memory array of claim 6 wherein the high-k dielectric materials of the laminate are about a same thickness as one another.

10. The NAND memory array of claim 6 wherein the control gate regions have terminal ends, and wherein the laminate wraps around the terminal ends of the control gate regions.

11. The NAND memory array of claim 6 wherein the control gate regions have terminal ends with top surfaces, bottom surfaces and sidewall surfaces extending from the top surfaces to the bottom surfaces, and wherein the laminate is along top and bottom surfaces of the terminal ends of the control gate regions, but is not along the sidewall surfaces of the terminal ends.

12. The NAND memory array of claim 6 wherein the high-k dielectric structures are adjacent to the control gate regions and are not adjacent to the second regions.

13. The NAND memory array of claim 6 wherein the high-k dielectric structures are adjacent to the control gate regions and to the second regions.

14. The NAND memory array of claim 6 wherein the insulative levels comprise voids.

15. The NAND memory array of claim 6 wherein the segments of the charge-storage material are laterally spaced from the conductive levels and a portion of the segments extend past the conductive levels to be laterally spaced from the insulative levels.

16. An integrated structure, comprising:
a vertical stack of alternating insulative levels and conductive levels;
the conductive levels having terminal regions, and having nonterminal regions proximate the terminal regions;
high-k dielectric material adjacent the terminal regions and extending vertically across the insulative levels;
charge-blocking material adjacent the terminal regions;
charge-storage material arranged in vertically-stacked spaced-apart segments; the segments being adjacent the charge-blocking material;
gate-dielectric material adjacent the charge-storage material; and
channel material adjacent the gate-dielectric material; and
wherein the high-k dielectric material is adjacent to the terminal regions and is not along the nonterminal regions; wherein the terminal regions have top surfaces and bottom surfaces, and have vertically-extending sidewall surfaces between the top surfaces and the bottom surfaces; wherein the high-k dielectric material extends along the top surfaces and the bottom surfaces of the terminal regions, and not along the sidewall surfaces of the terminal regions; and wherein the high-k dielectric material is a first high-k dielectric material; and further comprising a second high-k dielectric material between the first high-k dielectric material and the conductive levels; the second high-k dielectric material wrapping around the terminal regions and extending along the nonterminal regions; the second high-k dielectric material being of a different composition than the first high-k dielectric material.

17. The integrated structure of claim 16 wherein the second high-k dielectric material comprises one or more of aluminum oxide, hafnium oxide, hafnium silicate, zirconium oxide and zirconium silicate.

18. The integrated structure of claim 16 wherein the charge-blocking material wraps around the terminal regions of the conductive levels and does not extend along the nonterminal regions; and wherein the charge-blocking material extends vertically across the insulative levels.

19. An integrated structure, comprising:
a vertical stack of alternating insulative levels and conductive levels;
the conductive levels having terminal regions, and having nonterminal regions proximate the terminal regions;
high-k dielectric material adjacent the terminal regions and extending vertically across the insulative levels;
charge-blocking material adjacent the terminal regions;
charge-storage material arranged in vertically-stacked spaced-apart segments; the segments being adjacent the charge-blocking material;
gate-dielectric material adjacent the charge-storage material; and
channel material adjacent the gate-dielectric material; and
wherein the high-k dielectric material wraps around the terminal regions; wherein the terminal regions have top surfaces and bottom surfaces, and have vertically-extending sidewall surfaces between the top surfaces and the bottom surfaces; wherein the high-k dielectric material extends along the top surfaces, the bottom surfaces and the sidewall surfaces of the terminal regions, and is a first high-k dielectric material; wherein the first high-k dielectric material is not along the nonterminal regions; and further comprising a second high-k dielectric material between the first high-k dielectric material and the conductive levels; the second high-k dielectric material wrapping around the terminal regions and extending along the nonterminal regions; the second high-k dielectric material being of a different composition than the first high-k dielectric material.

20. The integrated structure of claim 19 wherein the first and second high-k dielectric materials are about a same thickness as one another.

21. The integrated structure of claim 19 wherein the charge-blocking material wraps around the terminal regions of the conductive levels and does not extend along the nonterminal regions; and wherein the charge-blocking material extends vertically across the insulative levels.

22. An integrated structure, comprising:
a vertical stack of alternating insulative levels and conductive levels;
the conductive levels having terminal regions, and having nonterminal regions proximate the terminal regions;
high-k dielectric material adjacent the terminal regions and extending vertically across the insulative levels;
charge-blocking material adjacent the terminal regions;
charge-storage material arranged in vertically-stacked spaced-apart segments; the segments being adjacent the charge-blocking material and laterally spaced from the conductive levels, a portion of the segments extending past the conductive levels to be laterally spaced from the insulative levels;
gate-dielectric material adjacent the charge-storage material;
channel material adjacent the gate-dielectric material; and
wherein the high-k dielectric material is adjacent to the terminal regions and is not along the nonterminal regions; wherein the terminal regions have top surfaces and bottom surfaces, and have vertically-extending sidewall surfaces between the top surfaces and the bottom surfaces; wherein the high-k dielectric material extends along the top surfaces and the bottom surfaces of the terminal regions, and not along the sidewall surfaces of the terminal regions; and wherein the high-k dielectric material is a first high-k dielectric material; and further comprising a second high-k dielectric material between the first high-k dielectric material and the conductive levels; the second high-k dielectric material wrapping around the terminal regions and extending along the nonterminal regions; the second high-k dielectric material being of a different composition than the first high-k dielectric material.

23. The integrated structure of claim 22 wherein the second high-k dielectric material comprises one or more of aluminum oxide, hafnium oxide, hafnium silicate, zirconium oxide and zirconium silicate.

24. The integrated structure of claim 22 wherein the charge-blocking material wraps around the terminal regions of the conductive levels and does not extend along the nonterminal regions; and wherein the charge-blocking material extends vertically across the insulative levels.

25. An integrated structure, comprising:
a vertical stack of alternating insulative levels and conductive levels;
the conductive levels having terminal regions, and having nonterminal regions proximate the terminal regions;
high-k dielectric material adjacent the terminal regions and extending vertically across the insulative levels;
charge-blocking material adjacent the terminal regions;
charge-storage material arranged in vertically-stacked spaced-apart segments; the segments being adjacent the charge-blocking material and laterally spaced from the conductive levels, a portion of the segments extending past the conductive levels to be laterally spaced from the insulative levels;
gate-dielectric material adjacent the charge-storage material;
channel material adjacent the gate-dielectric material; and
wherein the high-k dielectric material wraps around the terminal regions; wherein the terminal regions have top surfaces and bottom surfaces, and have vertically-extending sidewall surfaces between the top surfaces and the bottom surfaces; wherein the high-k dielectric material extends along the top surfaces, the bottom surfaces and the sidewall surfaces of the terminal regions, and is a first high-k dielectric material; wherein the first high-k dielectric material is not along the nonterminal regions; and further comprising a second high-k dielectric material between the first high-k dielectric material and the conductive levels; the second high-k dielectric material wrapping around the terminal regions and extending along the nonterminal regions; the second high-k dielectric material being of a different composition than the first high-k dielectric material.

26. The integrated structure of claim 25 wherein the first and second high-k dielectric materials are about a same thickness as one another.

27. The integrated structure of claim 25 wherein the charge-blocking material wraps around the terminal regions of the conductive levels and does not extend along the nonterminal regions; and wherein the charge-blocking material extends vertically across the insulative levels.

28. An integrated structure, comprising:
a vertical stack of alternating insulative levels and conductive levels;
the conductive levels having terminal regions, and having nonterminal regions proximate the terminal regions;
high-k dielectric material adjacent the terminal regions and extending vertically across the insulative levels;
charge-blocking material adjacent the terminal regions;
charge-storage material arranged in vertically-stacked spaced-apart segments; the segments being adjacent the charge-blocking material and laterally spaced from the conductive levels, a portion of the segments extending past the conductive levels to be laterally spaced from the insulative levels;
gate-dielectric material adjacent the charge-storage material;
channel material adjacent the gate-dielectric material; and
wherein the high-k dielectric material wraps around the terminal regions; wherein the terminal regions have top surfaces and bottom surfaces, and have vertically-extending sidewall surfaces between the top surfaces and the bottom surfaces; and wherein the high-k dielectric material extends along the top surfaces, the bottom surfaces and the sidewall surfaces of the terminal regions, and is not along the nonterminal regions.

29. An integrated structure, comprising:
a vertical stack of alternating insulative levels and conductive levels;
the conductive levels having terminal regions, and having nonterminal regions proximate the terminal regions;
high-k dielectric material adjacent the terminal regions and extending vertically across the insulative levels;
charge-blocking material adjacent the terminal regions;
charge-storage material arranged in vertically-stacked spaced-apart segments; the segments being adjacent the charge-blocking material and laterally spaced from the conductive levels, a portion of the segments extending past the conductive levels to be laterally spaced from the insulative levels;

gate-dielectric material adjacent the charge-storage material;

channel material adjacent the gate-dielectric material; and wherein at least portions of the high-k dielectric material comprise a laminate of two or more different high-k dielectric materials.

30. A NAND memory array, comprising:

a vertical stack of alternating insulative levels and conductive levels;

the conductive levels including control gate regions and second regions proximate the control gate regions;

high-k dielectric structures directly against the control gate regions and extending entirely across the insulative levels;

charge-blocking material adjacent the high-k dielectric structures;

charge-storage material adjacent the charge-blocking material; the charge-storage material being configured as segments which are vertically stacked one atop another, and which are vertically spaced from one another;

gate-dielectric material adjacent the charge-storage material;

channel material extending vertically along the stack and being adjacent the gate-dielectric material; and wherein the segments of the charge-storage material are laterally spaced from the conductive levels and a portion of the segments extend past the conductive levels to be laterally spaced from the insulative levels.

* * * * *